United States Patent [19]

Kurihara et al.

[11] Patent Number: 5,403,399
[45] Date of Patent: Apr. 4, 1995

[54] METHOD AND APPARATUS FOR VAPOR DEPOSITION OF DIAMOND

[75] Inventors: Kazuaki Kurihara; Kenichi Sasaki; Motonobu Kawarada, all of Atsugi; Nagaaki Koshino, Yokohama, all of Japan

[73] Assignee: Fujitsu Limited, Kawasaki, Japan

[21] Appl. No.: 905,226

[22] Filed: Jun. 29, 1992

Related U.S. Application Data

[60] Continuation of Ser. No. 500,056, Mar. 27, 1990, abandoned, which is a division of Ser. No. 177,504, Apr. 4, 1988.

[30] Foreign Application Priority Data

| Apr. 3, 1987 | [JP] | Japan | 62-083318 |
|---|---|---|---|
| Sep. 4, 1987 | [JP] | Japan | 62-220437 |
| Oct. 1, 1987 | [JP] | Japan | 62-245853 |
| Oct. 6, 1987 | [JP] | Japan | 62-250598 |
| Oct. 13, 1987 | [JP] | Japan | 62-257632 |
| Oct. 13, 1987 | [JP] | Japan | 62-257635 |
| Dec. 19, 1987 | [JP] | Japan | 62-320142 |
| Dec. 28, 1987 | [JP] | Japan | 62-330130 |
| Jan. 12, 1988 | [JP] | Japan | 63-003043 |

[51] Int. Cl.$^6$ .............................................. C23C 16/00
[52] U.S. Cl. ..................... 118/723 DC; 219/121.47; 219/121.48; 219/121.52
[58] Field of Search ............... 118/723, 723 DC; 219/121.47, 121.48, 121.52; 427/580

[56] References Cited

U.S. PATENT DOCUMENTS

| 3,578,943 | 5/1971 | Schoumaker | 219/121.48 |
|---|---|---|---|
| 3,630,679 | 12/1971 | Angus | 23/209 |
| 3,953,704 | 4/1976 | Bejat | 118/725 |
| 4,122,292 | 10/1978 | Karinsky | 219/121.11 |
| 4,264,642 | 4/1981 | Ferralli | 427/38 |
| 4,377,564 | 3/1983 | Dahlberg | 427/34 |
| 4,650,953 | 3/1987 | Eger | 219/121.51 |
| 4,678,718 | 7/1987 | Wang | 219/145.21 |
| 4,725,447 | 2/1988 | Pfender | 427/37 |
| 4,812,326 | 3/1989 | Tsukazaki et al. | 427/38 |
| 4,851,254 | 7/1989 | Yamamoto | 427/37 |

FOREIGN PATENT DOCUMENTS

| 0039417 | 11/1981 | European Pat. Off. |
|---|---|---|
| 0142176 | 5/1985 | European Pat. Off. |
| 3614384 | 1/1987 | Germany |
| 62-158195 | 7/1987 | Japan |
| WO-A-8503460 | 4/1986 | WIPO |
| WO-A-8602024 | 4/1986 | WIPO |

OTHER PUBLICATIONS

English Abstract of JP-A-63-195267.
English Abstract of JP-A-63-210010.
English Abstract of JP-A-63-210275.
English Abstract of JP-A-1-17867.
Chemical Abstracts, vol. 103, No. 20, Nov. 1985, p. 129, Abstract No. 162686a, Columbus, Ohio; & JP-A-60 118 693 (Mitsubishi Metal Corp.) Jun. 26, 1985.
Patent Abstracts of Japan, vol. 10, No. 17 (C-324) [2074], Jan. 23, 1986; & JP-A-60 171 294 (Mitsubishi Kinzoku K.K.) Sep. 4, 1985.
Patent Abstracts of Japan, vol. 9, No. 28 (C-264) [1751], Feb. 6, 1985; & JP-A-59 174 508 (Yoshitoshi Nanba) Oct. 3, 1984.
European Search Report, The Hague, Jun. 30, 1988.

*Primary Examiner*—Richard Bueker
*Attorney, Agent, or Firm*—Staas & Halsey

[57] ABSTRACT

An apparatus for a vapor deposition of diamond by:
  effecting an arc discharge while feeding a discharge gas between an anode and a cathode of a thermal plasma chemical vapor deposition device;
  radicalizing a gaseous carbon compound by feeding the gaseous carbon compound to a generated plasma jet; and
  permitting said radicalized plasma jet to impinge on a substrate to be treated, whereby a film of diamond is formed on said substrate.

5 Claims, 23 Drawing Sheets

METHOD AND APPARATUS FOR VAPOR DEPOSITION OF DIAMOND

This application is a continuation of application Ser. No. 07/500,056, filed Mar. 27, 1990, now abandoned, which is a division of Ser. No. 177,504, filed Apr. 4, 1988.

BACKGROUND OF THE INVENTION

1. Field of the Invention

The present invention relates to a method and apparatus for a vapor deposition of diamond. More specifically, it relates a highly efficient method and apparatus for uniformly vapor depositing diamond, especially a diamond film having a sufficient thickness and good film quality at a high film deposition rate.

2. Description of the Related Art

Diamond is an allotropy of carbon (C), exhibits a diamond structure, has a high Mohs hardness of 10, and has a superior thermal conductivity of 2000 W/mk, compared with other materials.

Also known is a diamond-like carbon which is an allotropy of the same element, and is transparent and insulative, although amorphous, and this product also exhibits a high thermal conductivity and hardness although less than that of diamond. These factors enable use of this material in various ways.

More specifically, this material has attracted attention as a substrate material for mounting a semiconductor integrated circuit by utilizing the high thermal conductivity thereof, and as a coating for tools by utilizing the high hardness thereof. Also, diamond-like carbon is presently used as a vibrating plate for a speaker, when coated on the surface of a titanium (Ti) metal plate.

Especially, diamond has a thermal conductivity of 2000 W/mk, which corresponds to as much as 4-fold that of copper, and yet also has an excellent hardness and insulating property, and therefore, is an ideal material for a heat sink of a semiconductor element and as the material for a circuit substrate. Also, diamond has an excellent light transmitting property over a wide wavelength range, and thus is also an excellent optical material. Further, since diamond has a wide band gap of 5.45 eV and is a semiconductor with a high carrier mobility, it has attracted attention for use for high performance devices such as a high temperature transistor, high speed transistor, etc.

As the vapor phase method of synthesizing diamond or a diamond-like carbon, such methods as chemical vapor deposition (CVD method), ion plating, ionized vapor deposition, sputtering, etc., have been proposed and investigated. Among, these methods, that showing the highest probable bulk production is the CVD method. This method can be classified, in accordance with the method of excitation of a reactive gas, into the hot filament CVD method, the microwave plasma CVD method, and the electron assisted CVD method, etc.

More specifically, as the method for vapor phase synthesis of diamond with a good quality, there are known chemical vapor deposition (CVD methods) such as the hot filament method (S. Matsumoto et al., Japan, J. Appl. Phys. 21(1981)L183), the microwave plasma CVD method (M. Kamo et al., J. Cryst. Growth. 62(1983)642), the electron assisted CVD method (A. Sawabe et al., Appl. Phys. Lett. 46(1985)146), etc.

However, according to these preparation methods, the film deposition rate of diamond is as low as several $\mu$m/h or lower, and although using an inexpensive device and starting materials, the cost is higher due to a poor productivity, and therefore, practical application is not yet viable. Also, the high frequency thermal plasma CVD method (Society of Applied Physics, Spring Season Lecture, March 1987) has a drawback in that the surface is graphitized at a film thickness of 30 $\mu$m or more, and thus, although a high film deposition rate of 1 $\mu$m/min can be obtained, a thick film cannot be prepared. The thermal plasma generated by high frequency has a low flow speed and, therefore, the substrate must be placed in contact with the thermal plasma. Accordingly, the temperature of the substrate surface becomes higher, and thus a thick film cannot be prepared. Also, since a large volume thermal plasma formation occurs, the flow speed of the thermal plasma is low and does not allow a sufficiently high cooling speed of the water-cooled substrate, whereby a uniform diamond film cannot be obtained.

Therefore, although there are various deposition methods available, and the deposition of diamond can be realized by each of these methods, the deposition rate of a film with a good quality such that only the peak of diamond can be detected according to the Raman spectroscopic method is as slow as 1 $\mu$m/h or less. Also, in the case of a diamond-like carbon, the deposition rate is as slow as about 10 $\mu$m/h, which poses a problem with respect to bulk production.

Accordingly, there is a need for a development of a deposition method with a rapid film deposition rate.

As described above, various methods have been proposed and investigated as a method of deposition of a diamond film, but even in the best CVD method, the deposition rate of the diamond is 1 $\mu$m/h or less, and therefore, the development a CVD method with a rapid film deposition rate has yet to be realized.

SUMMARY OF THE INVENTION

Accordingly, the objects of the present invention are to eliminate the above-mentioned disadvantages of the prior art and to provide a method and apparatus for a vapor deposition of diamond on a substrate and having a sufficient film thickness and good film quality at a high film deposition rate.

Other objects and advantages of the present invention will be apparent from the following description.

In accordance with the present invention, there is provided a method for a vapor deposition of diamond comprising the steps of:
  effecting an arc discharge while feeding a discharge gas between the anode and the cathode of a thermal plasma chemical vapor deposition device;
  radicalizing a gaseous carbon compound by feeding the gas to a generated plasma jet; and
  permitting the radicalized plasma jet to impinge on a substrate to be treated, whereby a film of diamond is formed on the substrate.

In accordance with the present invention, there is also provided a method for a vapor deposition of diamond comprising the steps of:
  feeding a gas containing hydrogen and a gaseous carbon compound into a thermal plasma generating device having an anode and a cathode;
  radicalizing the gas by a direct current arc discharge between the electrodes;

jetting out the thermal plasma as a plasma jet into a reduced pressure chamber; and quenching the plasma jet by permitting the hot yet to impinge on a cooled substrate, whereby a diamond film is deposited on the substrate.

In accordance with the present invention, there is further provided a method for a vapor deposition of diamond comprising the steps of:

effecting an arc discharge by applying a direct current between the inner walls of a plurality of nozzles opened in an enclosed body forming an electrode of one polarity and a plural of electrodes of the other polarity opposed thereto, thereby radicalizing or activating hydrogen and a gas containing a gaseous carbon compound to form a thermal plasma;

jetting the plasma jet into a reduced pressure chamber;

quenching the plasma jet by permitting the hot yet to impinge on a cooled substrate, whereby a diamond film is deposited on the substrate.

In accordance with the present invention, there is further provided a plasma jet generating device, which is a plasma jet generating device comprising an enclosed body provided with a discharge gas feed pipe, a feed pipe for a starting gas or a gas conveying solid particles and a direct current source and conductive wire, and having a nozzle for jetting plasma jet opened therein, characterized in that a plurality of nozzles are opened therein, the inner walls of the respective nozzles forming electrodes having the same polarity respectively, and a plurality of electrodes having an opposite polarity are positioned internally of the enclosed body so that they are opposed to the inner walls of the respective nozzles.

In accordance with the present invention, there is further provided a method for a vapor deposition of diamond comprising the steps of:

feeding a gas to a thermal plasma generating device in the form of a torch having an anode and a cathode;

radicalizing the gas by direct current arc discharge between electrodes to form a thermal plasma;

jetting the thermal plasma as a plasma jet through a nozzle at the tip end of the torch;

blowing a cooling gas into the plasma jet to quench the thermal plasma and form an active non-equilibrium plasma containing at least radical products formed by a radicalization of the carbon compound fed to the plasma jet and having a high concentration of radicals; and bringing a substrate into contact with the non-equilibrium plasma, whereby a diamond film is deposited on the substrate.

In accordance with the present invention, there is further provided a method for a vapor deposition of diamond by effecting an arc discharge by a DC plasma torch having a cathode and an anode while feeding a discharge gas between the cathode and the anode and irradiating the formed plasma jet onto a substrate to be treated to form a film of diamond thereon, which comprises using at least two plasma torches, forming a gas with a higher discharge voltage into a plasma in one torch, forming a reactive gaseous carbon compound with a lower discharge voltage into a plasma in the remaining torch and permitting both plasmas to impinge in the form of a jet onto the substrate, thereby forming a diamond film.

In accordance with the present invention, there is further provided a method for a vapor deposition of diamond comprising the steps of:

using a plurality of plasma torches, permitting a plurality of plasma jets to mutually impinge on each other, and forming a carbon source into a plasma in those plasma jets to form diamond.

In accordance with the present invention, there is further provided a method for a vapor deposition of diamond, comprising the steps of:

forming a discharge gas by arc discharge and a starting material containing at least a gaseous carbon compound into plasma;

jetting the thermal plasma as a plasma jet; and quenching the plasma jet to deposit a diamond on a substrate, wherein at least the starting material which destabilizes the arc discharge is fed to the center of the initiation end of the plasma jet without passing through the arc discharge portion.

BRIEF DESCRIPTION OF THE DRAWING

The present invention will be better understood from the description set forth below with reference to the accompanying drawings, in which.

DESCRIPTION OF THE PREFERRED EMBODIMENTS

According to the present invention, a diamond film is deposited on a substrate to be treated by applying a thermal plasma CVD device which has been used for the synthesis of a ceramic fine powder.

Figure 1:
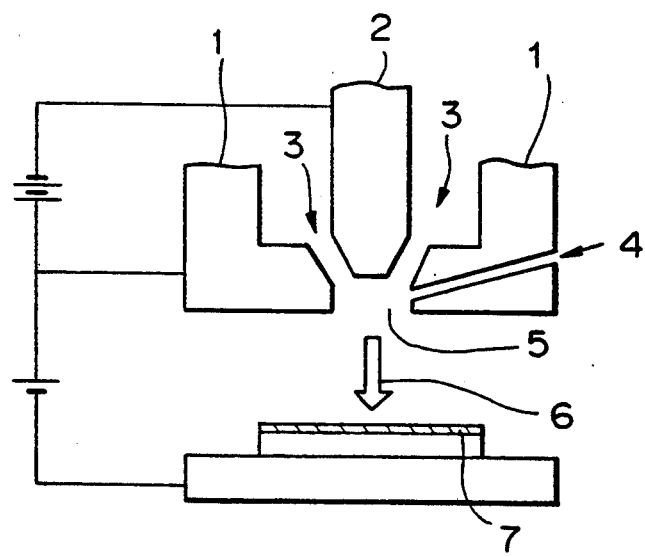
FIG. 1 illustrates the principle of the thermal plasma CVD method as practiced by the present invention.

FIG. 1 shows the principle of the thermal plasma method used in the present invention CVD, in which an arc discharge is effected by applying a voltage while passing a discharge gas 3 between the anode 1 and the cathode 2, thereby generating an arc plasma having a temperature of 5000° C. or higher.

The starting gas 4 fed to the arc plasma generating portion through the inlet provided on the anode 1 is rapidly heated to a high temperature and activated, thereby generating radicals with a high density, simultaneously with an expansion of the volume to be jetted as a ultra-high speed plasma jet 6 through the nozzle 5.

Using the above method, an attempt has been made to synthesize of a high melting compound powder such as silicon carbide (SiC) or silicon nitride ($Si_3N_4$). More specifically, experiments have been made wherein, for the production of SiC, silane ($SiH_4$) and methane ($CH_4$) as the starting gases are fed into an arc plasma, and for the production $Si_3N_4$, $SiH_4$ and ammonia ($NH_3$) are fed to be activated and cause a radical reaction to occur for the preparation of a powder.

The present invention is an advance on this method, and is intended to effect film formation by permitting the plasma jet 6 to impinge on the substrate to be treated 7, thereby carrying out an efficient CVD reaction on the substrate before an extinction of the short life radicals. Further, during the reaction on the substrate, energy obtained though photoexcitation by an irradiation of UV-rays generated during the arc discharge and the impinging of the plasma jet, is added.

Accordingly, the present invention generates radicals with a far higher density than achieved by the prior art by an activation in a high temperature arc having a temperature of more than 5000° C., and at the same time, feeds the radicals onto the substrate to be treated and causes a radical reaction to occur by obtaining energy from the above photoexcitation and impingement, thereby effecting an efficient diamond deposition.

In a synthesis of diamond according to the second embodiment of the present CVD method, a gas mixture of a carbon compound such as methane, acetylene, alcohol, acetone, methylamine, dichloroethane etc., with hydrogen is decomposed to be activated, and diamond is deposited on a substrate at a temperature suitable for a vapor phase deposition of diamond, namely 400° to 1500° C. In the synthesis of diamond, it is considered that an active species such as hydrogen atoms and hydrocarbon radicals play an important role in the vapor phase, and to enhance the speed of deposition of diamond, a plasma with a high density of such an active species may be prepared and fed onto the substrate surface.

Figure 5:
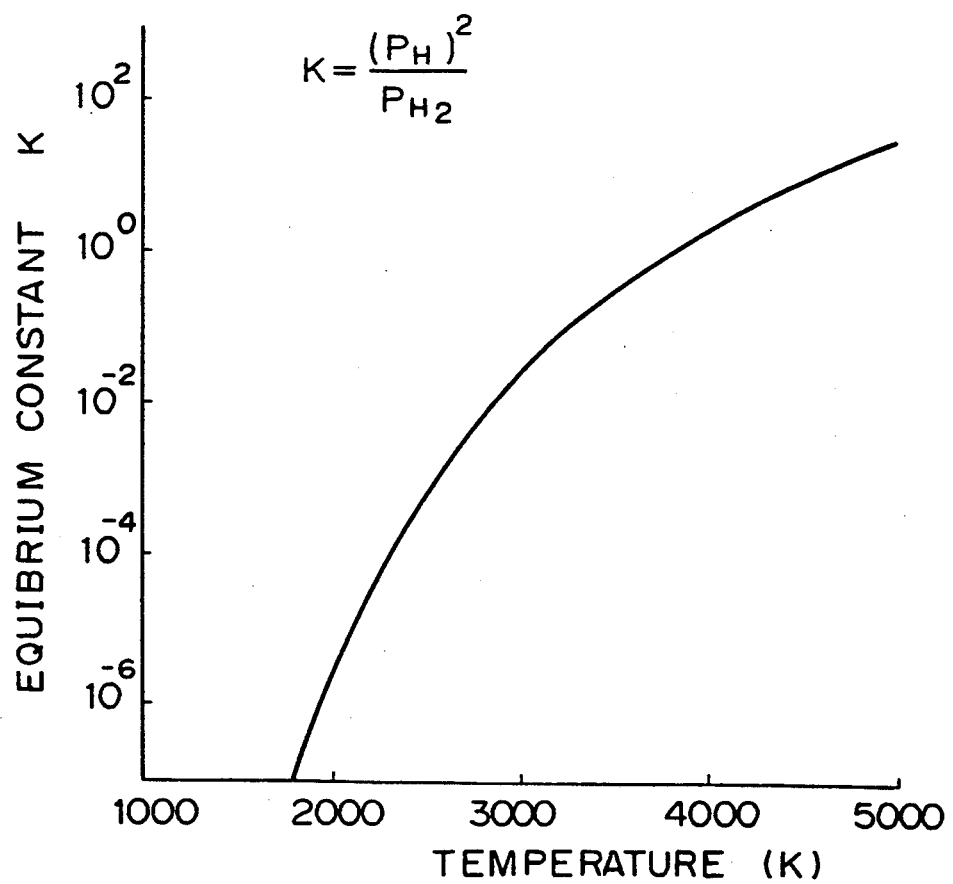
FIG. 5 is a graph of temperature changes of the dissociation reaction equilibrium constant of a hydrogen molecule.

As the plasma with an extremely high activity and a high dissociation degree of gas molecules, there is known a thermal plasma in which the temperatures of various chemical species such as ions, electrons, neutral particles in the plasma are substantially the same, and the temperature thereof is 5000K or higher. FIG. 5 shows the temperature change of the equilibrium constant $K=(P_H)^2/P_{H2}$ in the dissociation reaction of a hydrogen molecule $H_2 \rightleftharpoons 2H$, but at 5000K, it can be understood that almost all of the hydrogen molecules are dissociated into hydrogen atoms. However, when the thermal plasma at this temperature is in contact with the substrate, the substrate temperature becomes too high, and it becomes difficult to synthesize diamond.

Figure 3:
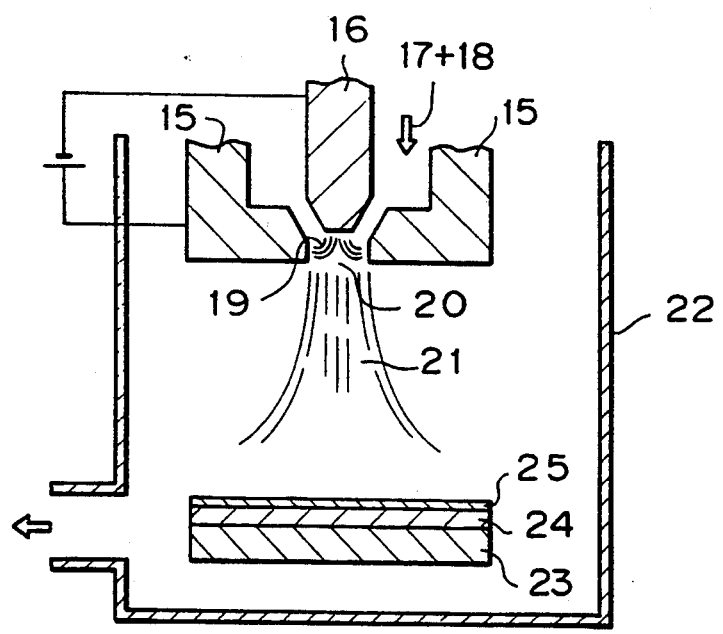
FIG. 3 illustrates an embodiment of the thermal plasma vapor phase synthetic method.

FIG. 3 is an illustration of diamond synthesis by the direct arc discharge thermal plasma jet CVD method according to the present invention.

When an arc 19 is discharged by applying a direct current voltage between the anode 15 and the cathode 16 while flowing a gas containing hydrogen 17 and a gaseous carbon compound 18, the gas is abruptly heated between narrow electrodes to become a thermal plasma having a temperature of 5000° C. or higher around the nozzle 20. In this case, due to the abrupt temperature elevation, the volume is expanded, whereby the thermal plasma becomes a supersonic plasma jet 21 and is jetted out through the nozzle 20 into the chamber 22.

Figure 29:
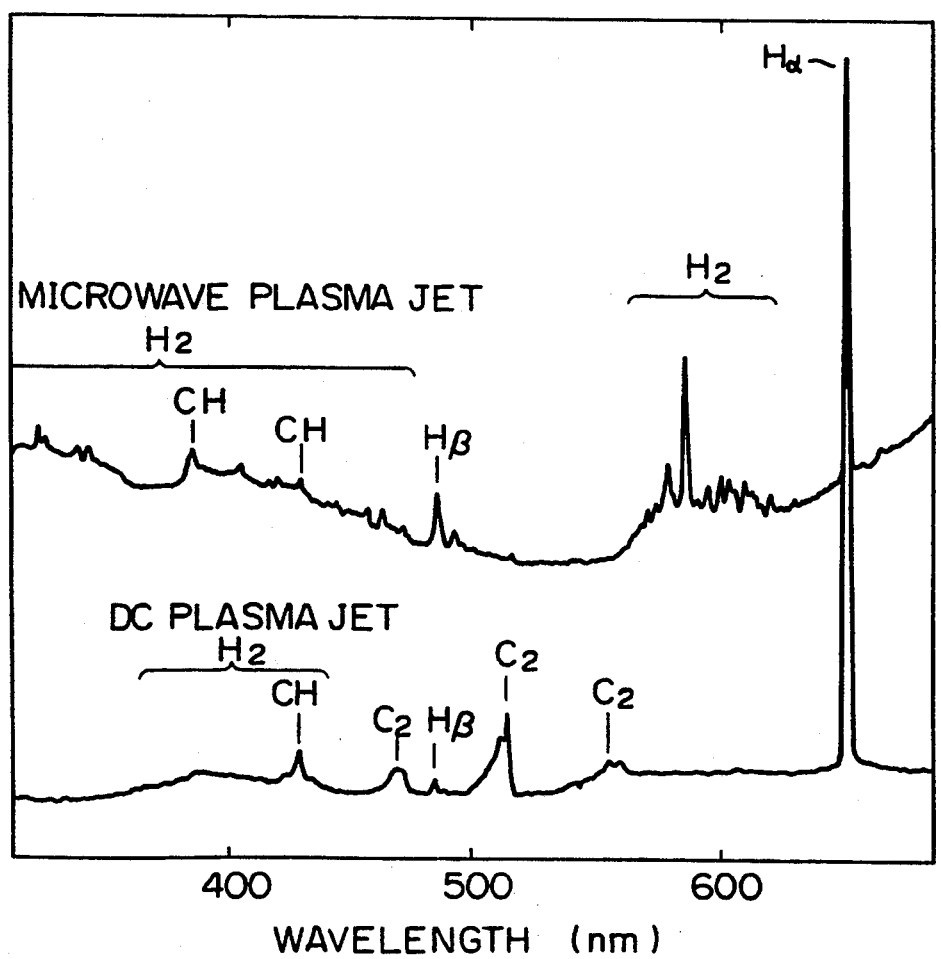
FIG. 29 is a graph showing emission spectra of both the DC plasma jet according to the present invention and the conventional microwave plasma.

FIG. 29 shows emission spectra of both the DC plasma jet according to the present invention and the conventional microwave plasma. Two spectra are normalized by the peaks of Hα. In microwave plasma, broad and strong emissions of hydrogen molecule (<480 nm, 560–620 nm) were detected. But, in DC plasma jet, emission due to hydrogen molecule were very weak. Those result mean that the dissociation degree of hydrogen is very high for DC plasma jet in comparison with conventional microwave plasma.

By quenching the plasma jet by permitting the plasma jet 21 to impinge on the substrate 24, in which is cooled with a high efficiency, active species such as hydrogen atoms with a short life react on the substrate before extinguishment, to synthesize the diamond film 25.

Further, in the reaction on the substrate, motion energies derived through photoexcitation with strong UV-rays generated during the arc discharge and by a collision between supersonic particles, are applied.

Accordingly, in the present invention, the chemical reaction can be effected with a much higher efficiency, compared with the method of the prior art, and therefore, diamond can be synthesized at a high deposition rate.

In the present invention, any carbon compound may be used as the starting gas, but preferably a hydrocarbon, or a hydrocarbon or a halogenated carbon containing oxygen, nitrogen or halogen in the molecule, is used.

The stability of the arc discharge can be improved by mixing an inert gas such as argon, helium, etc., in addition to the hydrogen of the starting gas and the carbon compound of the starting gas. In this case, although the film deposition rate may be lowered, an advantage is gained in that the uniformity of the surface of the film can be enhanced.

Also, by mixing a small amount of an oxidative gas such as oxygen, water, hydrogen peroxide, carbon monooxide, etc., the effect of a non-diamond carbon by etching can be enhanced.

Figure 4:
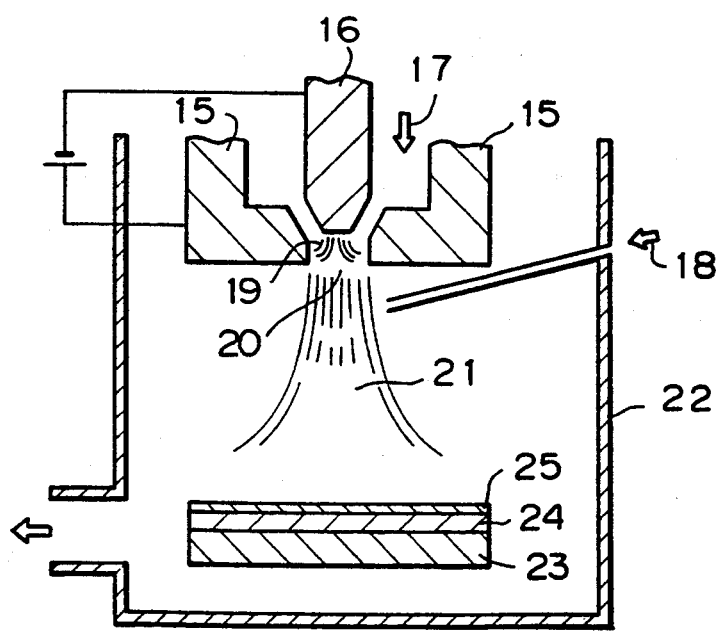
FIG. 4 illustrates another embodiment of the thermal plasma vapor phase synthetic method.

The starting gas 18 may be fed together with the hydrogen of the discharge gas 17 between the electrodes, but as shown in FIG. 4, it may be also fed into the plasma jet 21 jetted from between the electrodes. However, in this case, the starting gas must be fed uniformly into the thermal plasma jet.

Since hydrogen, which is difficult to discharge with a high ionization potential as shown in FIG. 5, is used as the discharge gas, the electrode materials should preferably have a high heat resistance. Tungsten having a rare earth element oxide such as lanthanum oxide, yttrium oxide, cerium oxide, etc., added thereto is an excellent the electrode material. Further, to prevent an entrainment of impurities from the electrodes, preferably a carbon electrode having a high purity is used.

According to the third embodiment of the present invention, since the thermal plasma when generated is heated to a high temperature of about 5000° C., it is abruptly expanded and jetted out through the nozzle. Since the nozzle has a narrow aperture of 1 to 2 mm, the area of the cooled substrate against which the jet from one nozzle impinges is about 25 mm$^2$. In the present invention, the plasma jet is jetted out through a plurality of nozzles and therefore, the film deposition area can be broadened.

Also, the uniformity of the film during deposition can be enhanced by mixing an inert gas such as argon or helium in either the hydrogen of the discharge gas or a carbon compound of the starting gas, or in both, or an oxidative gas such as oxygen, hydrogen peroxide or water can be mixed to remove non-diamond carbons mixed in the film formed by etching.

Figure 6:
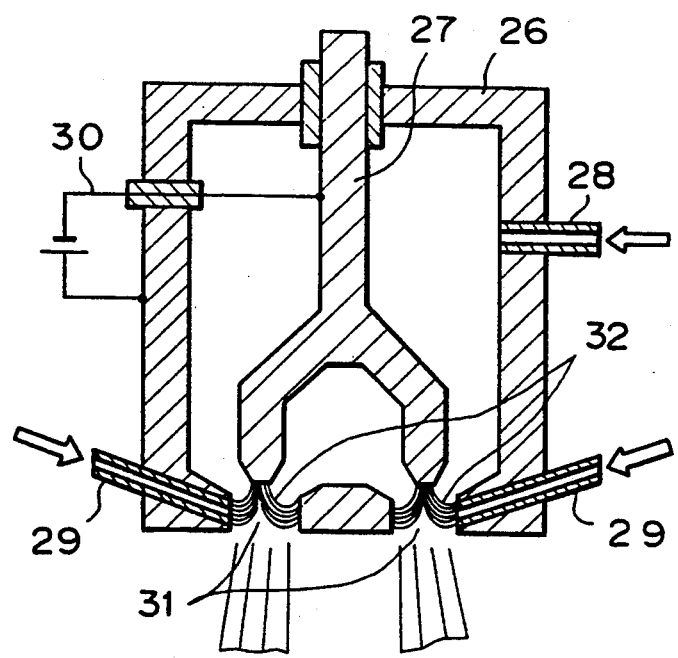
FIG. 6 is a sectional view of the thermal plasma jet generating device of the present invention.
Figure 6:
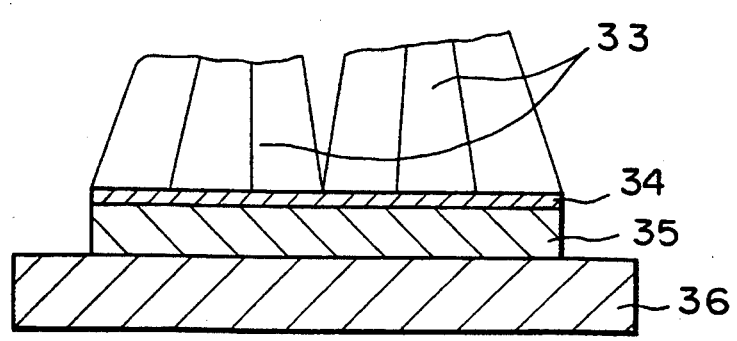

The plasma jet generating device, as shown in FIG. 6, comprises an enclosed body for forming an anode 26, and a cathode 27 supported through an insulating member, etc. internally thereof. The discharge gas feed pipe 28 is opened into the enclosed body, and the feed pipe 29 of a starting gas or a gas conveying solid particles is opened into the inner portion of a plural number of nozzles 31 provided on the electrode 26. A direct current voltage is applied to the electrodes from the conductive wire 30, to generate a continuous discharge arc between the electrodes, thereby activating the discharge gas and the starting material gas to form a plasma jet 33 having a high temperature.

Figure 7:
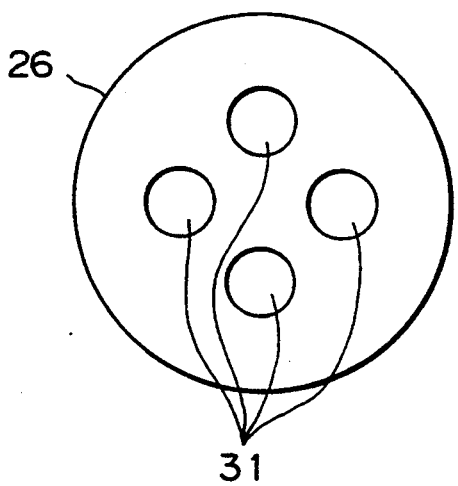
FIG. 7 is a bottom view of the plasma jet generating device of the present invention.
Figure 9:
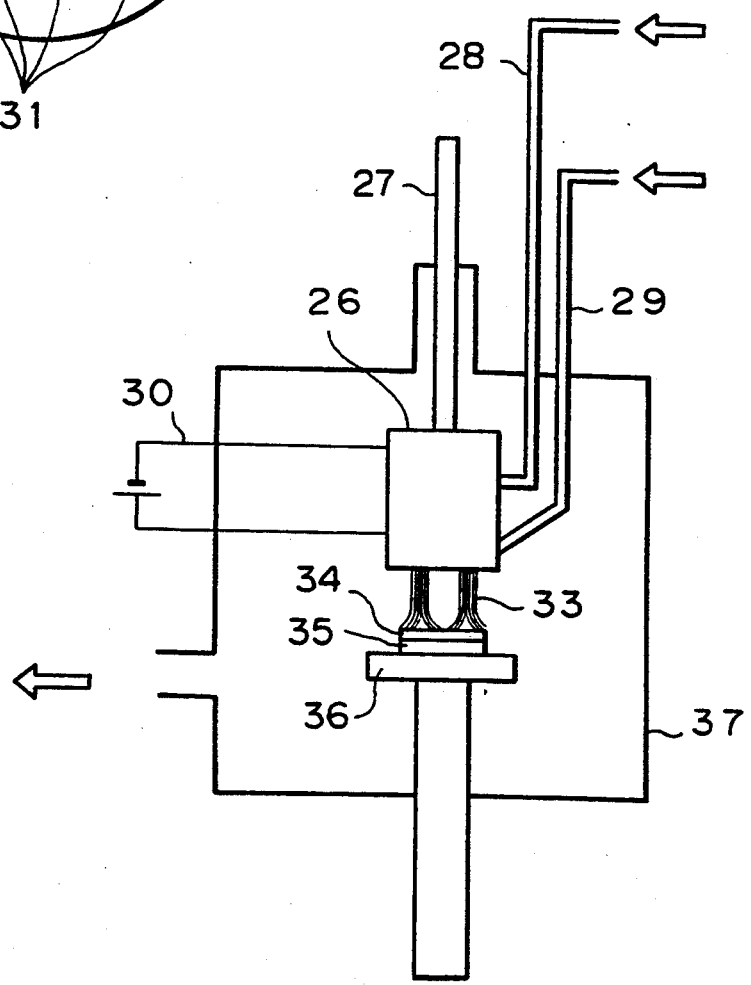
FIG. 9 is an illustration of the vapor phase synthetic device utilizing the plasma jet generating device of the present invention.

For a chemical vapor deposition of diamond according to the present invention, as shown in FIG. 9, the thermal plasma generating device was set in a reduced pressure chamber 37, and the chamber 37 was provided with a water-cooled substrate holder 36 for supporting the substrate 35 opposed to the nozzles 31. The four nozzles 31 shown in FIG. 7 each had an aperture of 2 mm, the distance between the nozzle centers was made 5 mm at a minimum, and a substrate 35 20 mm square was arranged 10 mm below the nozzles 31. The pressure in the chamber was reduced to 100 Torr, hydrogen gas was fed at a flow rate of 1000 SCCM from the discharge gas feed pipe 28, and methane at a flow rate of 100 SCCM, into the nozzle 31 from the starting gas feed pipe 29. A direct current power of 2 kW was applied between the electrodes, and the plasma jet 33 generated by arc discharge was quenched by a continuous impingement against the substrate for 1 hour, whereby a diamond film having a film thickness of about 80 $\mu$m and an area of about 4 cm$^2$ was be formed. The area of this film was 16-fold that obtained when employing a single nozzle. The starting gas feed pipe 29 can be also opened externally of the nozzle 31 as shown in FIG. 8, to blow the gas into the plasma jet.

According to the present invention, in the direct current plasma jet chemical vapor deposition method of diamond, a high speed film formation is possible, and the film forming area can be greatly increased, and thus an improvement in cost and productivity can be realized.

In the above example, a plasma jet is used to effect a chemical vapor deposition of diamond, but it is also possible to feed a powder comprising an inorganic material or metal material conveyed together with a gas such as argon through the feed pipe of the starting gas, or a gas conveying liquid or solid fine particles, into the inner portion of the nozzle 31, and melt the inorganic material or metal material with the plasma jet, thereby forming a plasma spray film on the substrate.

Figure 8:
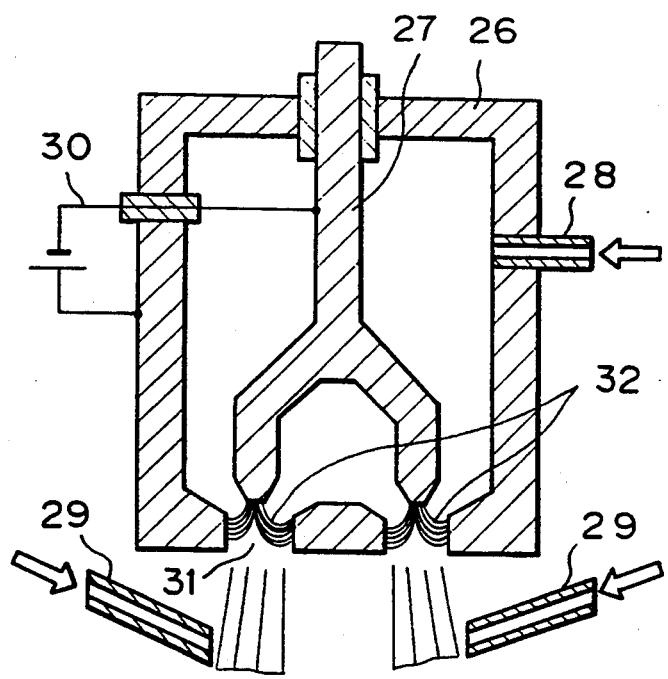
FIG. 8 is a sectional view of another plasma jet generating device of the present invention.
Figure 8:
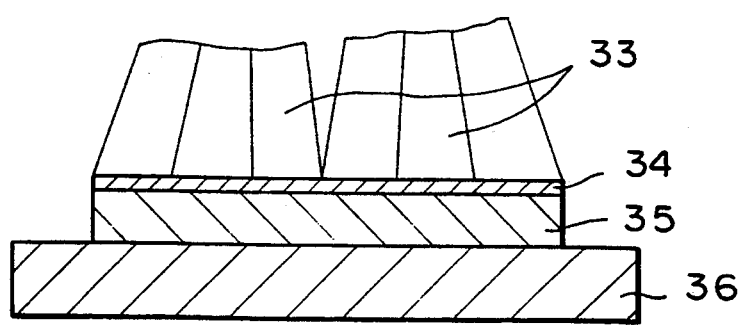

As shown in FIG. 8, through the feed pipe 29 of the starting gas or the gas carrying liquid or solid fine particles opened externally of the nozzle 31, powdery fine particles of an inorganic material or metal material may be conveyed by Ar gas, etc., and blown into the plasma jet. As the metal material, high melting metals, superalloys, cermet, etc. can be used. As the inorganic material, a super-conductive material of Y—Ba—Cu—O system, Bi—Sr—Ca—Cu—O system, ceramics, graphite, glass, etc. may be used. As the inorganic material, a powder, for example, a powder of Y—Ba—Cu—O system superconductive ceramic was fed through the gas feed pipe to form a plasma spray film with a thickness of about 100 $\mu$m and an area of about 4 cm$^2$. This plasma spray film was found to exhibit superconductivity at liquid nitrogen temperature, with an electrical resistance of zero at an absolute temperature of 88.5K.

According to the fourth embodiment of the present invention, in stead of quenching the thermal plasma by impingement against a cooled substrate, the method of blowing a gas into the plasma jet (gas cooling method) is employed.

This method according to the present invention can create a non-equilibrium plasma irrespective of the substrate, because the thermal plasma is cooled momentarily by compulsorily mixing the plasma jet with the gas at about room temperature. Accordingly, by maintaining a material to be treated in the non-equilibrium plasma at a temperature capable of forming a diamond, a diamond can be synthesized at a high speed on the surface. The preferable substrate temperature is 800° C. to 1300° C.

Figure 10:
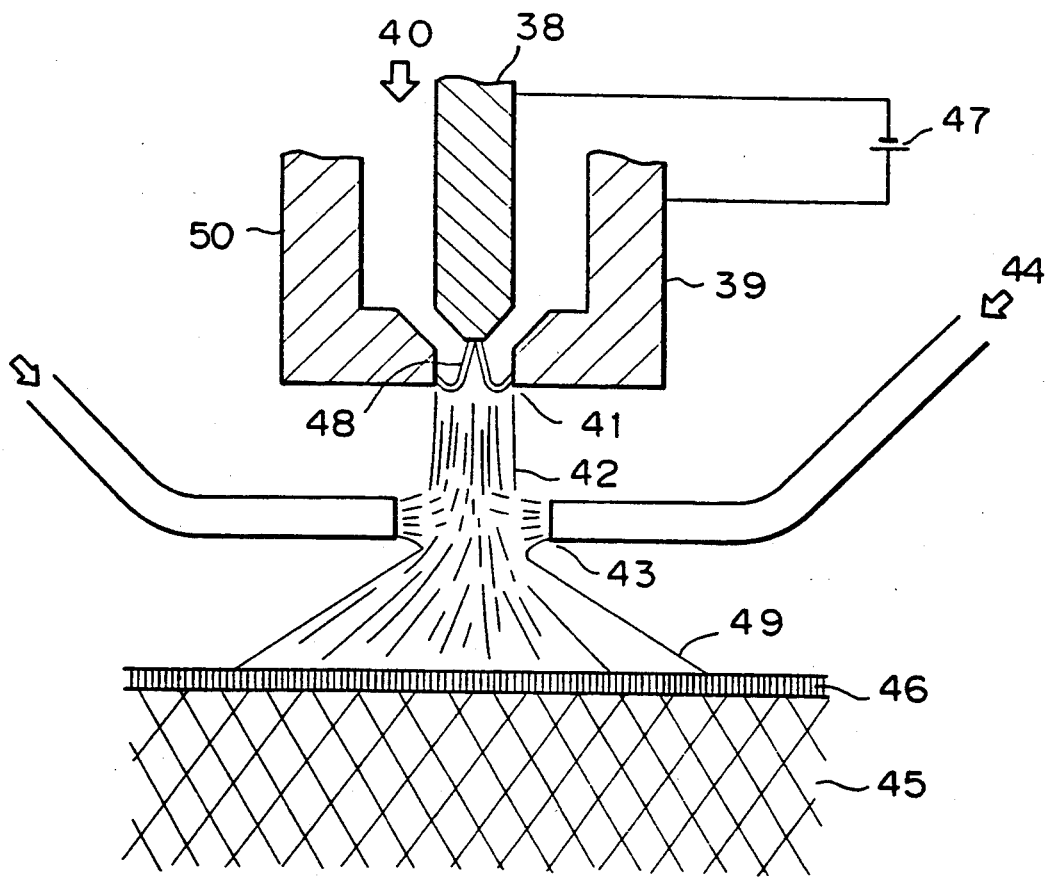
FIG. 10(a) illustrates the principle of the DC plasma vapor phase synthesis of the present invention.
FIG. 10(b), FIG. 10(c) are sectional views of the plasma torch.
Figures 10B, 10C:
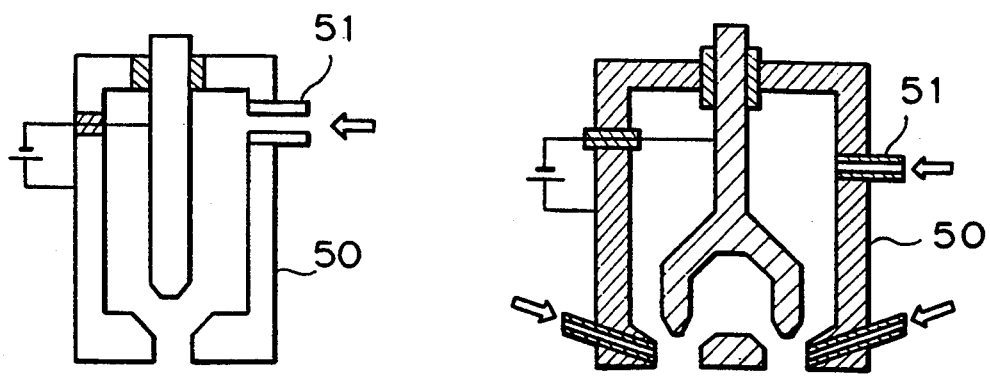

FIG. 10 shows the principle of the synthesis of diamond according to the DC plasma jet CVD method by the gas cooling of the present invention, wherein 38 is a cathode, 39 an anode, 40 a discharge gas, 41 a nozzle, 42 a plasma jet, 43 a cooling gas jetting outlet, 44 a cooling gas, 45 a substrate, 46 a diamond film, 47 an arc power source, 48 an arc, and 49 a non-equilibrium plasma. As a plasma torch 50, one having a single electrode shown in FIG. 10(b) or one having multiple electrodes shown in FIG. 10(c), etc., can be used.

While flowing a discharge gas 40 comprising hydrogen gas and a gaseous carbon compound, a direct current voltage is applied between the cathode 38 and the anode 39 to excite an arc discharge 48, whereby the discharge gas is abruptly heated to form a thermal plasma having a temperature of 5000° C. or higher near the nozzle 41. During this operation, due to a volume expansion caused by the abrupt temperature elevation, the thermal plasma becomes a supersonic plasma jet 42 and is jetted out through the nozzle 41.

Hydrogen gas is blown as the cooling gas 44 against the plasma jet 42, to effect a compulsory mixing, thereby quenching the thermal plasma to generate the non-equilibrium plasma 49. By placing the substrate 45 in the non-equilibrium plasma 49, active species such as hydrogen atoms with a short life react before extinction on the substrate to grow the diamond film 46 on the surface thereof.

Figure 11A:
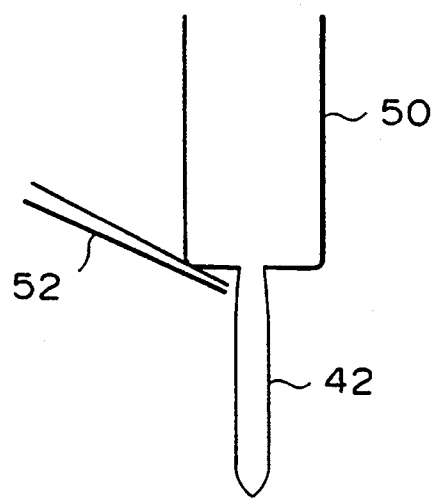
FIGS. 11(a) and (b) are a drawing and a photograph showing the state of the plasma jet according to the DC plasma vapor phase synthesis of an embodiment of the present invention.
Figure 12A:
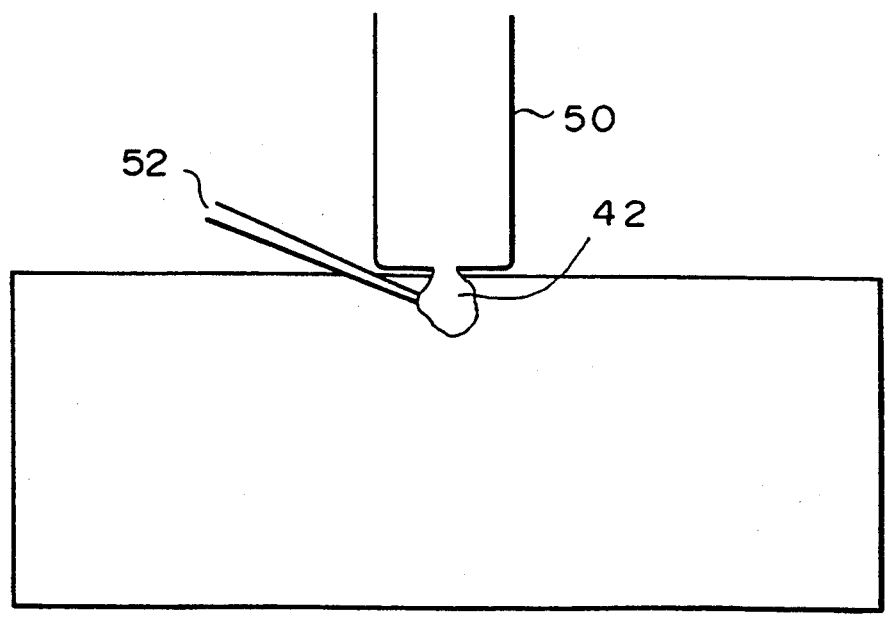
FIGS. 12(a) and (b) are a drawing and a photograph showing the state of the plasma jet according to the DC plasma vapor phase synthesis of the other embodiment of the present invention.
Figure 11B:
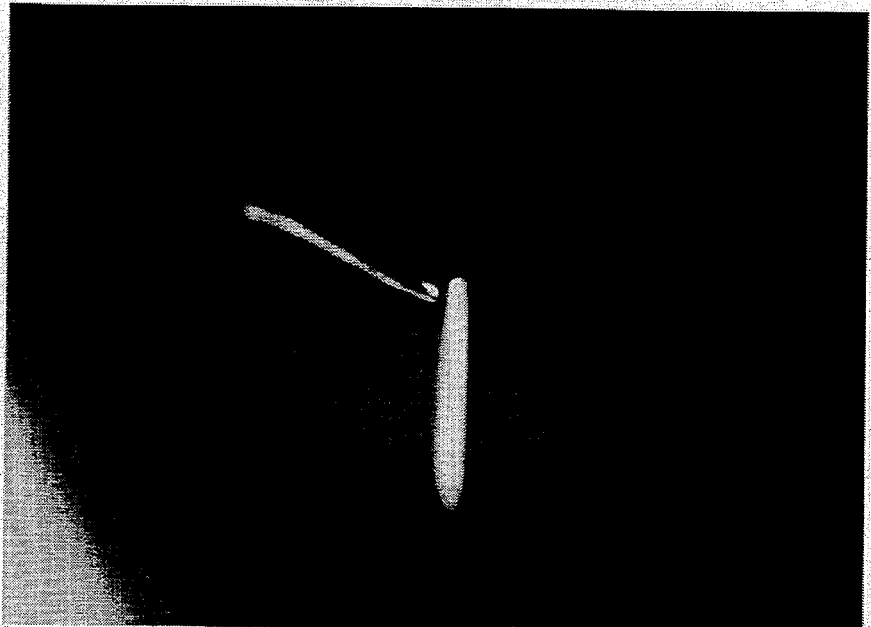
Figure 12B:
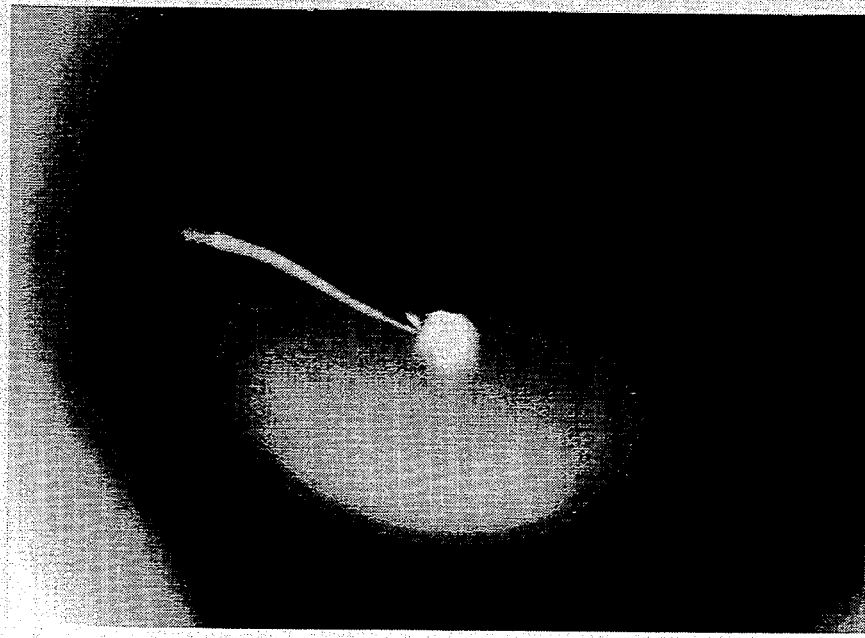

FIGS. 11(a) and (b) and FIGS. 12(a) and (b) show the plasma jet when a flow of cooling gas is not passed and the plasma jet when a flow of cooling gas is passed. In the case of FIGS. 12(a) and (b), when gas cooling is effected, it can be understood that the length of the plasma jet must be extremely short to effect quenching of the thermal plasma.

Therefore, comparing when the present invention with the DC plasma jet CVD method of the prior art, because the thermal plasma can be quenched irrespective of the substrate, there is no restriction on the type of substrate, used and thus a diamond can be grown at a high speed on any substrate.

In the present invention, any hydrocarbon may be used as the starting gas, but preferably to use hydrocarbon or halogenated carbon containing oxygen, nitrogen or halogen in the molecule is used.

By mixing an inert gas such as argon, helium other than hydrogen and a carbon compound of the starting gas of the discharging gas, the stability of the arc discharge can be improved. In this case, although the film deposition rate may be lowered, an advantage is obtained in that the uniformity of the surface of the film is enhanced.

Also, by mixing a small amount of an oxidative gas such as water, hydrogen peroxide, carbon monooxide, the effect of removing non-diamond carbon by etching can be enhanced.

Since hydrogen having a high ionization potential and difficult to discharge is used as the discharge gas, the electrode materials preferably have a high heat resistance. Tungsten having a rare earth element oxide such as lanthanum oxide, yttrium oxide, selenium oxide, etc. added thereto is an excellent electrode material. Further, to prevent an entrainment of impurities from the electrodes, preferably a carbon electrode having a high purity is used.

As described above, the methods for the synthesis of diamond film of the prior art are not commercially satisfactory, and according to the fifth embodiment of the present invention, a new method for a synthesis of a diamond film utilizing the principle of plasma flame spraying has been created, and thus it has become possible to industrially synthesize a diamond film on the substrate.

However, in this method, in which, for example, a gas mixture of hydrogen and a gaseous carbon compound such as methane is used as the gas and is chemically vapor deposited to form a diamond film by a thermal plasma CVD device, a problem arose in that the discharge became unstable and a stable plasma jet was not obtained, due to, for example:

(1) an extremely high discharge voltage of the hydrogen, (2) a heat generation and volume expansion due to a decomposition of methane, (3) the reaction of the carbon generated by the decomposition of methane attached on the electrode of a flame spraying device with the electrode, etc., whereby the substrate temperature and the plasma amount blown are changed and a homogeneous diamond film cannot be synthesized.

Figure 13:
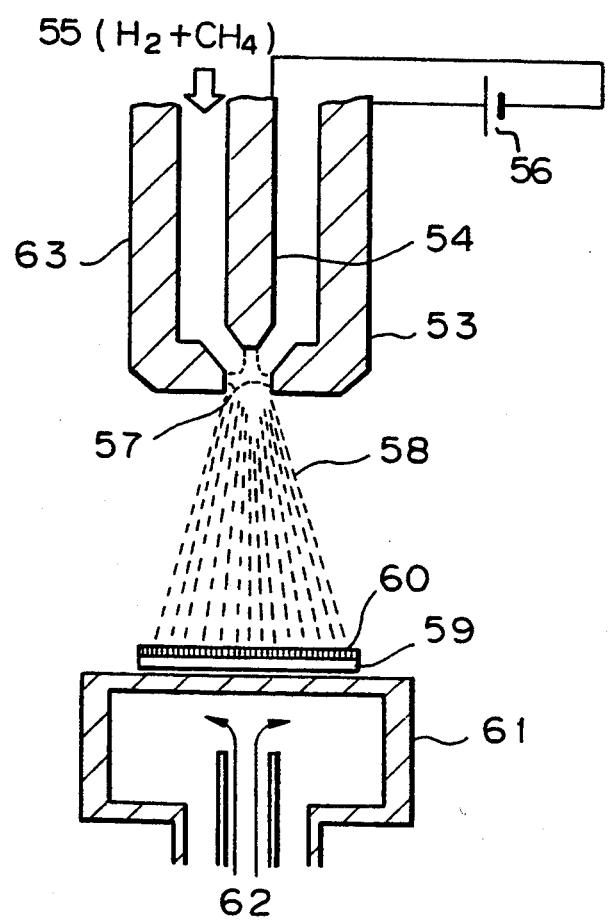
FIG. 13 schematically illustrates a formation of diamond on a substrate according to the thermal plasma CVD method.

FIG. 13 illustrates the principle of the thermal plasma CVD method as mentioned above, which excites an arc discharge 57 by applying a voltage by a direct current power source 56 while flowing a discharge gas ($H_2+CH_4$) 55 between the anode 53 and the cathode 54, to generate an arc plasma of 5000° C. or higher.

The starting gas 55 fed to the arc plasma generating portion of the plasma torch 63 is abruptly heated to a high temperature to be activated and generate radicals at a high density, whereby the volume is expanded and an ultra-sonic high speed plasma is jetted from the nozzle as the plasma jet 58.

According to this method, the plasma jet 58 is made to impinge on the substrate 59 to be treated to perform a CVD reaction with a good efficiency on the substrate before the extinction of radicals with a short life, thereby forming the diamond film 60. The substrate 59 used for the above purpose is placed on a water-cooled substrate holder 61, and cooled with a cooling water 62 fed to the water-cooled holder 61, to a temperature of, for example, 400° to 1500° C., preferably 800° to 1300° C.

Figure 14:
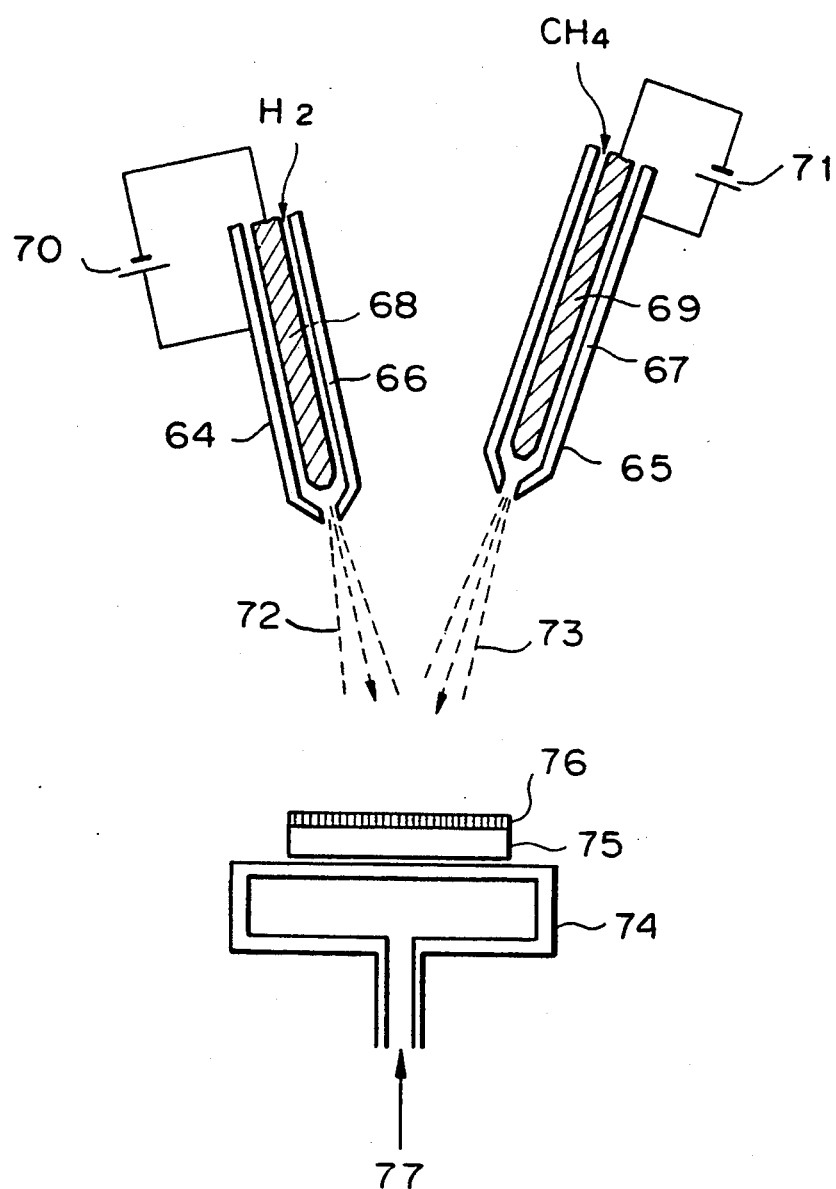
FIG. 14 schematically illustrates a thermal plasma CVD device used in the practice of the present invention.

Nevertheless, as described above, although a diamond film can be efficiently deposited in the vapor phase on the substrate, a stable plasma jet can not be obtained for the reasons mentioned above, thus causing the problem that a homogeneous diamond film cannot be synthesized. In contrast, according to the present invention, as shown in FIG. 14, two plasma torches 64 and 65 are prepared, and $H_2$ gas (or a gas mixture of $H_2$ and an inert gas according to a conventional method) is introduced into one torch, while methane ($CH_4$) gas (or a gas mixture of $CH_4$ and an inert gas such as Ar) is introduced into the other torch, and an arc discharge is excited by applying voltages between the anodes 66 and 67 and the cathodes 68 and 69, respectively, from the direct current power sources 70 and 71, thereby jetting plasma jets 72 and 73. These plasma jets deposit a homogeneous diamond film 76 on the substrate 75 placed on the water-cooled substrate holder 74.

It is considered that a large number of fine diamond nuclei are formed by permitting a plurality of plasma jets to mutually impinge on each other, forming a carbon containing compound into a plasma in the plasma jets, and quenching the compound. Accordingly, a smooth diamond film having an excellent uniformity can be prepared, different from the prior art in which only a few diamond nuclei were grown and thus the surface of the diamond film was uneven, according to the sixth embodiment of the present invention.

Figure 15:
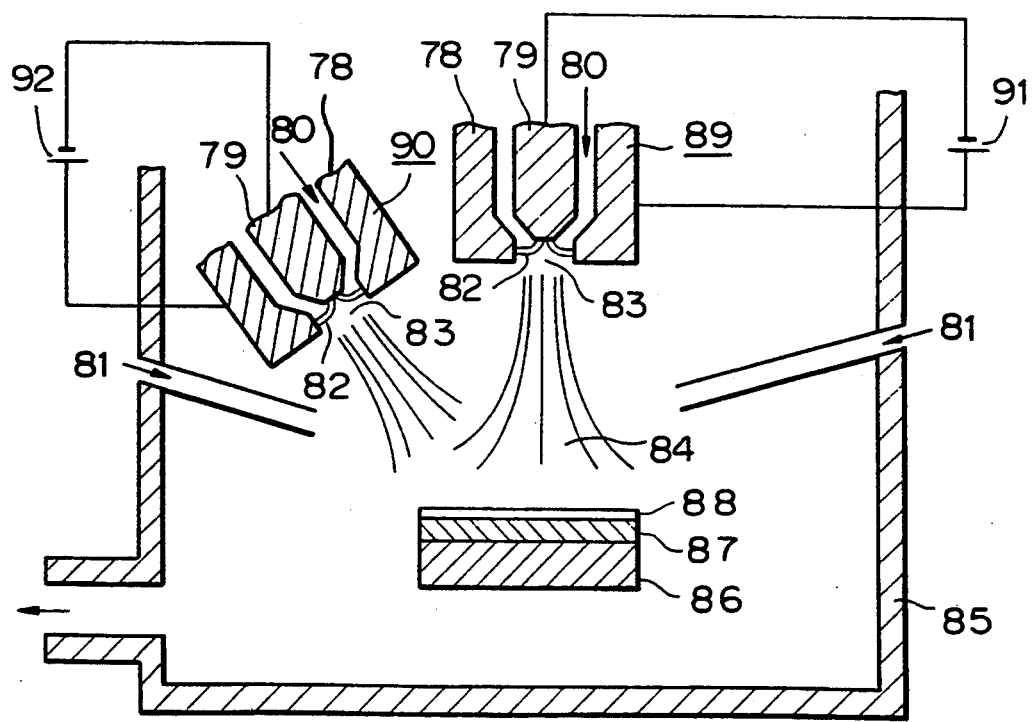
FIG. 15 illustrates the principle of the plasma jet CVD method of the present invention.

FIG. 15 illustrates the principle of a device in which another plasma jet generating torch is mounted on one thermal plasma CVD device, wherein 78 is an anode, 79 a cathode, 80 a discharge gas or a discharge gas containing a starting gas, 81 a cooling gas or a cooling gas containing a starting gas, 82 an arc, 83 a nozzle, 84 a plasma jet, 85 a vacuum chamber, 86 a substrate holder, 87 a substrate, and 88 a diamond film.

Figure 16:
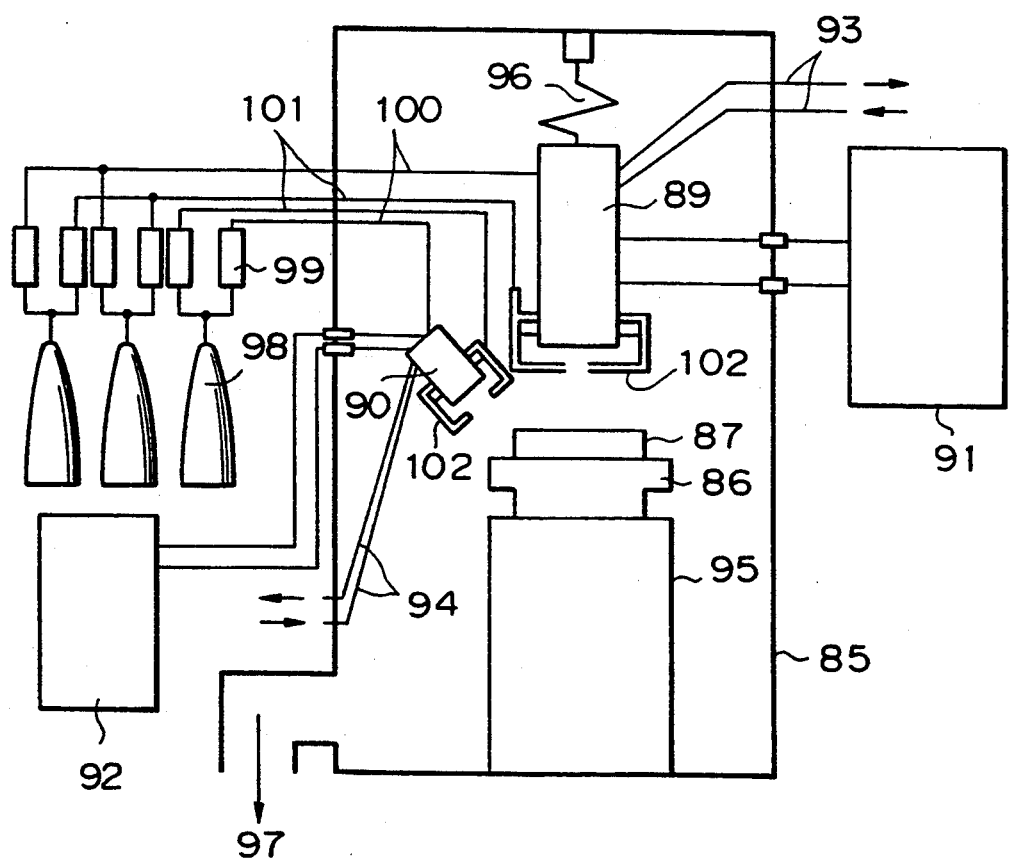
FIG. 16 is an overall view of a device used for the practice of the plasma jet CVD method of the present invention.

FIG. 16 is an overall view of a device for practicing the present invention, wherein 89 is a first plasma torch and 90 a second plasma torch, 91 and 92 are arc power sources for the respective torches, 93 and 94 are cooling water arrangements for the respective torches, 95 is a substrate manipulator, 96 a torch manipulator, 97 an evacuation system, 98 a gas bomb, 99 a flow meter, 100 a discharge gas or a discharge gas feed pipe containing a starting gas, 101 a starting gas and/or cooling gas feed pipe, and 102 a cooling gas jetting pipe.

Figure 17:
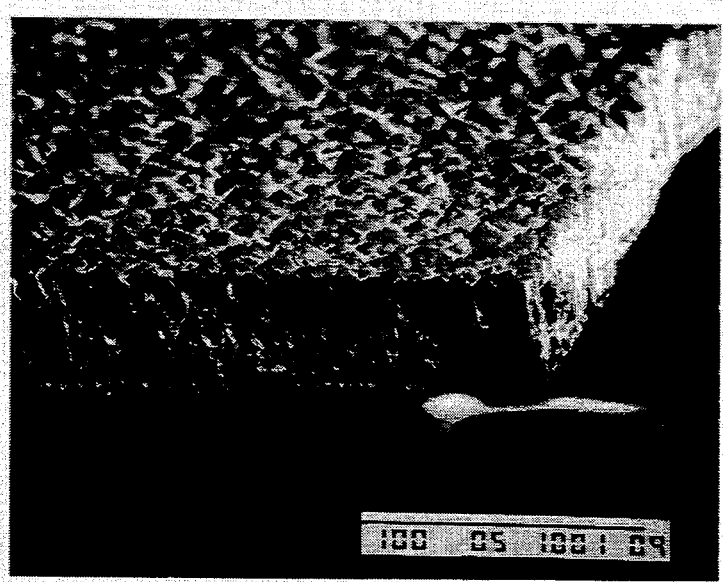
FIG. 17 shows the a structure of the diamond film crystal according to the present invention.
Figure 18:
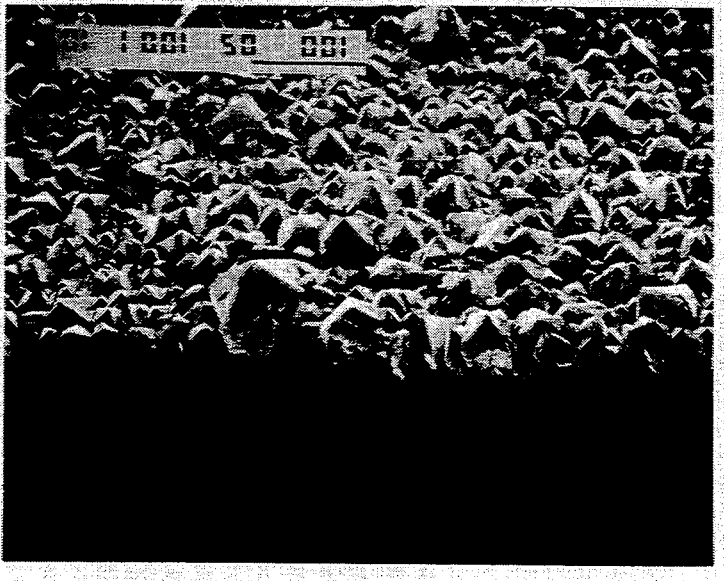
FIG. 18 shows the structure of a diamond film crystal according to the other embodiment of the present invention.

An Si substrate 87 of 5 cm square is set 100 mm below the torch 89, and after evacuation to $1 \times 10^{-2}$ Torr by a rotary pump, discharge gas $H_2$ is fed at 50 SLM, and a starting gas $CH_4$ at 500 SCCM to the torch 89 under a discharge power of 3 kW and a pressure in the system of 100 Torr. At the same time, while a discharge gas $H_2$ at 20 SLM and a starting gas at 100 SCCM under discharge power of 1 kW was fed to the torch 90, and a film was formed with the torch at a distance from the substrate of 35 mm and at an angle from the substrate of 60 degree, for 1 hour. When this film was analyzed by X-ray diffraction and Raman spectroscopy, it was found that a film exhibiting a peak of diamond was prepared. FIG. 17 shows the diamond film prepared by two plasma torches according to the present invention and having a film thickness of 35 $\mu m$, wherein the film forming speed was 100 $\mu m/hr$. FIG. 18 shows the diamond film prepared by only the plasma torch 89 according to the comparative method. According to the present invention, a diamond having a smooth and uniform surface can be thus prepared at a high speed.

In the above Example, hydrogen is fed from the discharge gas feed pipe 100 and methane from the starting gas feed pipe 101 to the plasma torches 89 and 90, but it is also possible to feed both the hydrogen and the methane from the discharge gas feed pipe 100, or feed cooled gas $H_2$ and methane from the starting gas and/or cooling gas feed pipe 101. Also, various modifications can be practiced such as feeding a discharge gas and a starting gas to only one of the plasma torches, and only a discharge gas to the other plasma torch, etc. The essence is that a plurality of plasma jets are irradiated, and a carbon source is formed into a plasma in the plasma jets to form a diamond on the substrate. Also, as the angles of the plurality of plasma jets, preferably, for the deposition speed, one should be vertical to the substrate; but they can be set at an optimum predetermined angle as desired.

As the above plurality of plasma jets, direct current plasma jets by direct current arc discharge have been mentioned, but it is also possible to use a plurality of plasmas of various kinds such as an RF plasma jet by high frequency discharge, optical arc plasma jet by optical arc discharge with laser beam, and plasma jet by microwave plasma jet alternate current discharge with microdischarge, etc. As the plasma generating atmosphere, an atmosphere under a reduced pressure is preferred, but atmospheric pressure or an atmosphere under pressurization can be also used for diamond formation. Further, this method is also applicable for the synthesis of diamond powder.

According to the sixth embodiment of the present invention, in the DC plasma jet CVD method, a diamond film can be prepared at a high speed and with a smooth and uniform surface, whereby the coating application scope can be broadened to a great extent. Also, a diamond heat sink or diamond circuit substrate for a semiconductor device can be easily realized.

The method for an epitaxial growth of diamond film of the seventh embodiment of the present invention comprises jetting out a starting material containing a carbon source fed into a plasma and growing a diamond by quenching the thermal plasma.

In the diamond growth method, hydrogen is generally used as the discharge gas, and any carbon compound may be used as the starting gas for the carbon source, but preferably a hydrocarbon or an organic substance containing O, N, halogen, etc. in the molecule is used. An inert gas such as Ar, He, etc, may be also mixed in the discharge gas or the starting gas. In this case, the stability of the plasma can be further improved, but the film deposition rate is lowered. Also, to enhance the etching effect of non-diamond carbon such as amorphous carbon, a small amount of an oxidative gas such as $O_2$, $H_2O$, $H_2O_2$, CO, etc. may be also mixed in the starting gas.

Further, by mixing a minute amount of gas such as $B_2H_6$, $NH_3$, $PH_3$, etc. into the starting gas, or by feeding it separately into the plasma jet, a semi-conductor diamond can be also obtained.

The starting gas is fed to the center of the initiation end of the plasma jet without passing through the arc discharge portion. For that purpose, it is advantageous to use the plasma jet jetting device of the present invention as described below. When the plasma jet jetting device of the present invention is used for the plasma flame spraying of a high temperature super-conductive oxide (Ba—Y—Cu—O system, Bi—Sr—Ca—Cu—O system, etc.), fine powder of the super-conductive oxide is fed together with a carrier gas through 109 in FIG. 19, to be melted in the plasma and a effect film formation on the substrate. Of course, in this case, as the plasma atmosphere, an oxidative atmosphere, oxygen atmosphere, an atmosphere in air, etc., may be used.

Figure 19:
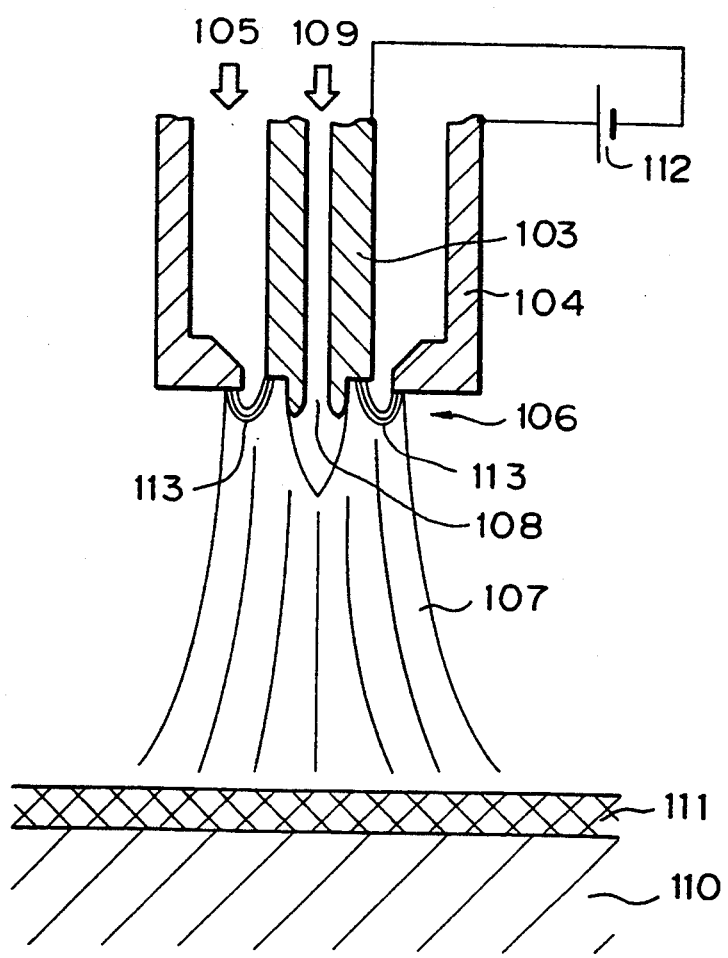
FIG. 19 illustrates the principle of the plasma jet jetting device of the present invention.

The plasma jet jetting device of the present invention, as shown in FIG. 19, has an feed hole for the starting gas (or the gas containing the starting material powder) 109 extending along the center axis of the internal electrode 103, with the starting gas jetting outlet 108 being positioned at the center of the jetting nozzle 106 of the external electrode 104, and an arc 113 discharged between the electrode 103 and the external electrode 104, but the starting gas (or the gas containing the starting material powder) 109 will not come into contact with the arc 113. Accordingly, a uniform formation of the arc 113 will not be obstructed. Moreover, since the starting gas (or the gas containing the starting material powder) 109 is released to the center portion of the initiation end of the plasma jet 107, the distribution of the plasma formed in the plasma jet 107 can be made uniform and utilized for the formation and growth of the deposited product by using of this for a vapor phase deposition or thermal plasma, whereby a uniform and smooth film can be grown.

Note, by using this device in a growth of diamond and a material other than diamond as the substrate, a polycrystal diamond can be synthesized on the surface.

FIG. 19 illustrates the principle of growing a diamond film by the device of the present invention.

This device is adapted to feed a starting gas through the jetting outlet provided at the center of the cathode into the plasma jet so as to uniformly feed the starting gas into the plasma jet, whereby the uniformity of the film thickness can be enhanced, or a generation of graphite can be inhibited in the case of a starting gas which is a carbon compound. In the FIG. 103 is a cathode, 104 an anode, 105 a discharge gas, 106 a nozzle, 107 a plasma jet, 108 a starting gas jetting outlet, 109 a starting gas, 110 a substrate, 111 a diamond film, 112 an arc power source, and 113 an arc.

While flowing hydrogen gas at 20 liter/min as the discharge gas 105 and methane gas at 0.2 liter/min as the starting gas 109, a direct current voltage of 90 V, 10 A is applied between the anode 104 and the cathode 103, to excite an arc discharge 113, whereby the discharge gas is heated to become a thermal plasma having a temperature of 5000° C. or higher around the nozzle 106. In this case, due to volume expansion caused by the abrupt temperature elevation, the thermal plasma becomes a supersonic plasma jet 107, which is jetted out through the nozzle 106. The starting gas is not passed through the arc discharge portion, but fed directly into the plasma jet, to be decomposed and activated. The plasma jet is quenched by impingement against a molybdenum substrate 5×5×0.5 mm to grow a diamond film, and as the result, a polycrystal diamond film with a thickness of 200 μm was obtained in 1 hour. When the surface roughness of the film was measured, $R_{max}$ was found to be 10 μm, which was a great improvement when compared with the $R_{max}$ 50 μm according to the method in which the starting material gas is fed together with the discharge gas.

In this device, since no starting gas is contained in the arc, a stable discharge can be obtained. Also, since all of the starting gas is fed into the plasma jet, a generation of graphite can be inhibited.

In the case of diamond growth, since it is advantageous to use hydrogen, which can be discharged only with difficulty due to a high ionization potential, it is preferable to use an electrode material having a high heat resistance and able to generate a stable discharge. Tungsten having lanthanum oxide, yttrium oxide, cerium oxide, etc., added thereto is an excellent electrode material. Also, to prevent an entrainment of impurities from the electrode, a carbon electrode having a high purity preferably used.

The plasma jet jetting device of the present invention can be used advantageously for a synthesis of diamond as described above, but can of course be utilized for other purposes.

EXAMPLES

The present invention will now be further illustrated by, but is by no means limited to, the following Examples, wherein all parts and percentages are expressed on a weight basis unless otherwise noted.

Figure 2:
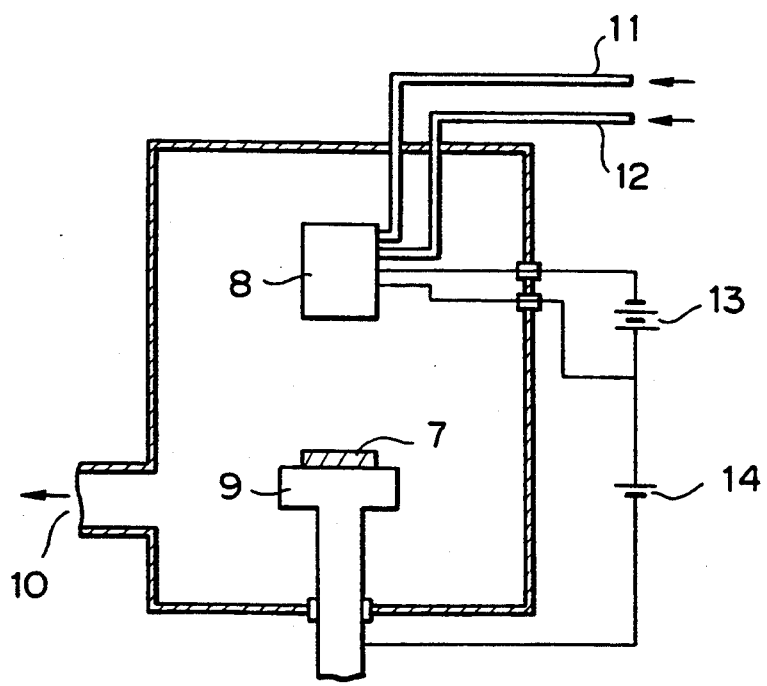
FIG. 2 schematically illustrates a thermal plasma CVD apparatus for practicing the present invention.

Example 1 (FIGS. 1 and 2)

FIG. 2 is a schematic illustration of a thermal plasma apparatus for practicing the present invention, and the plasma jet generating portion shown in FIG. 1 is shown as a plasma torch 8.

Here, within the device is disposed a substrate holder 9 opposed to the plasma torch 8, which holder is water-cooled and a substrate to be treated 7 is placed thereon.

Also, the device is connected to an evacuation system 10.

Next, to the plasma torch 8 are connected a discharge gas feed pipe 11 for feeding a discharge gas between the discharge electrodes 1 and 2 and a starting gas feeding pipe 12 for feeding the starting gas to the arc plasma, and also provided are an arc power source 13 for supplying power to the discharge electrodes 1 and 2 and a bias power source 14 for concentrating radicals onto the substrate to be treated 7.

In the following, as an example, a silicon (Si) substrate 30 mm square was treated, and an interval of 300 mm was maintained between the substrate and the plasma torch 8.

First, after the device was internally evacuated to $1 \times 10^{-2}$ Torr by the evacuation system 10, hydrogen gas ($H_2$) was fed at a rate of 1000 SCCM through the discharge gas feed pipe 11, and a methane gas ($CH_4$) was fed at a rate of 100 SCCM through the starting material feed pipe 12, and the vacuum degree within the chamber at was maintained 100 Torr by the evacuation system 10. Next, 2 kW was applied as the arc power source and 300 V as the bias voltage.

Then, after performing a thermal plasma CVD, a film of diamond was formed to a thickness of about 10 μm within 1 hour, and an analysis thereof by X-ray diffraction and Raman spectroscopy exhibited only a peak of diamond.

This deposition speed is higher by 1 cipher or more, compared with a CVD of the prior art in which the deposition rate 1 is 1 μm or less.

According to the present invention, since radicals with an extremely high density can be generated, a film of diamond can be formed at a deposition rate higher by 1 cipher, compared with the prior art, whereby the demand for substrates for LSI's can be satisfied.

Example 2 (FIG. 3)

Both the anode 15 and cathode 16 in FIG. 3 were made of tungsten having 2% by weight of yttrium oxide added thereto, the plasma torch has a water-cooled structure, and was fixed on a manipulator (not shown) in the chamber 22, with the direction of the nozzle 20 being variable.

The water-cooled substrate holder 23 was movable vertically and/or laterally, and the nozzle-substrate distance was variable.

A silicon wafer 24 of 5 mm square and 0.2 mm thick was fixed on the substrate holder 23, and after the chamber 22 was evacuated to $2 \times 10^{-3}$ Torr, as shown in FIG. 3, $H_2$ was passed at a flow rate of 20 liter/min under a pressure of 1 kg/cm , and $CH_4$ as the starting gas 18 was passed at a flow rate of 40 cc/min under a pressure of 1 kg/cm$^2$, between the electrodes, while the pressure in the chamber 22 was maintained at 100 Torr. From a constant current arc power source, a current of 10 A was passed between the electrodes and maintained for about 5 minutes until the voltage became constant. The voltage at this time was 72 V.

The water-cooled substrate holder 23 was slowly brought close to the nozzle 20, the distance between the nozzle and the substrate was fixed at 5 mm, and a synthesis of diamond was carried out under this state for 1 hour. The diamond synthesized was evaluated by scanning electron microscope photography (SEM), X-ray diffraction, Raman spectroscopy, and a measurement of hardness.

| Example No. | 4 | 5 | 6 | 7 | 8 | 9 |
|---|---|---|---|---|---|---|
| Inter-electrode feeding gas (l/min) | H₂ 20 CH₄ 1 H₂O 1 | H₂ 20 CH₃OH 0.5 | H₂ 20 Ar 10 | H₂ 20 CH₄ 1 | H₂ 20 CH₃Cl 0.04 | H₂ 20 CH₃F 0.04 |
| Gas feeding into jet (l/min) |  |  | triethylamine 0.1 H₂ 2 | Ar 2 H₂O₂ 0.5 |  |  |
| Substrate | Si | Si | Mo | Si | Si | Si |
| Thickness of substrate (μM) | 200 | 200 | 200 | 200 | 200 | 200 |
| Pressure (Torr) | 120 | 120 | 200 | 130 | 120 | 120 |
| Arc current (A) | 10 | 10 | 10 | 10 | 10 | 10 |
| Nozzle-substrate distance (mm) | 5 | 5 | 10 | 5 | 5 | 5 |
| Film deposition rate (μm/h) | 80 | 45 | 70 | 60 | 60 | 30 |

Figure 20:
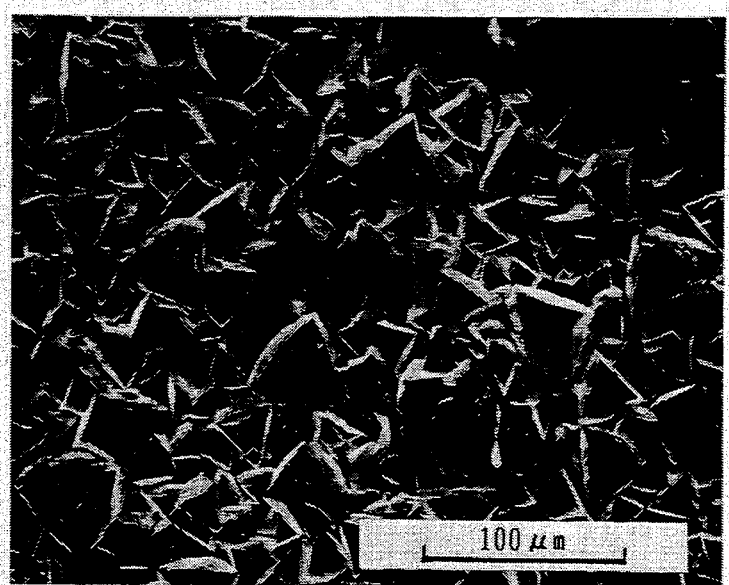
FIG. 20 is an SEM showing the surface of a diamond film.
Figure 21:
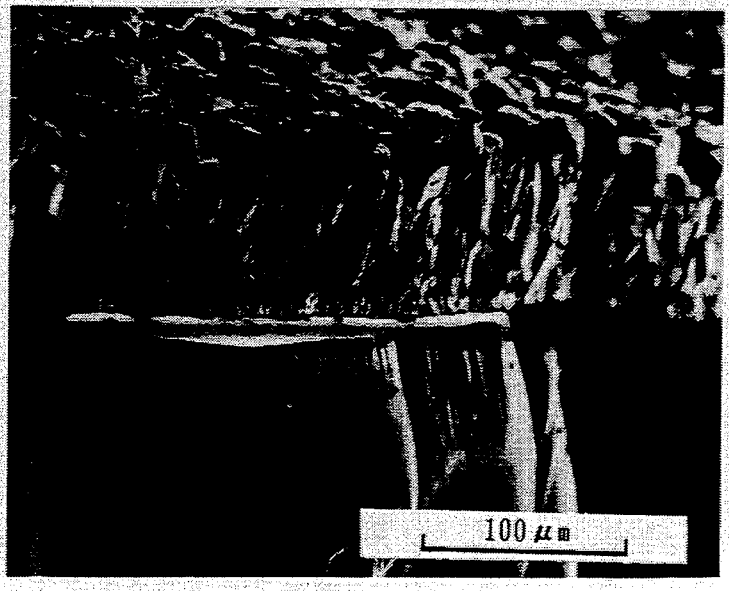
FIG. 21 is an SEM showing the surface and a sectional view of a diamond film.
Figure 22:
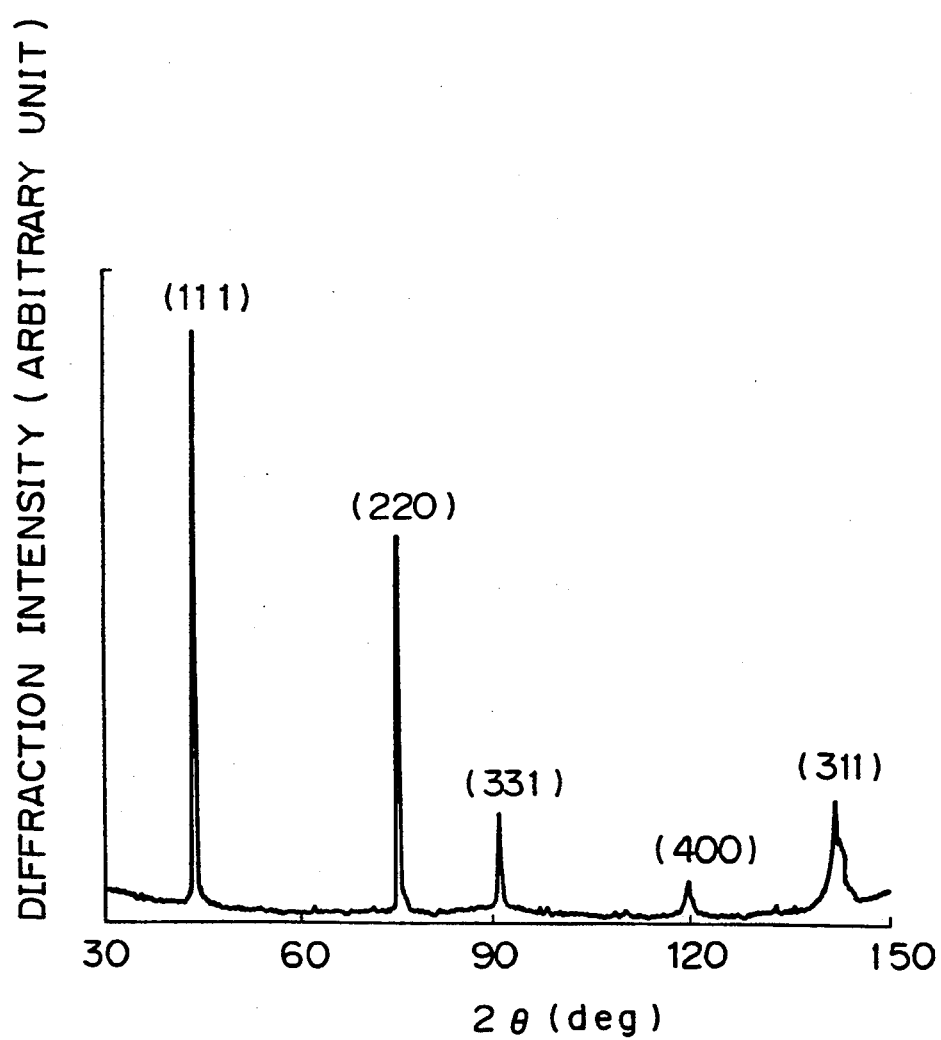
FIG. 22 is a graph showing the results of an X-ray diffraction of a diamond film.
Figure 23:
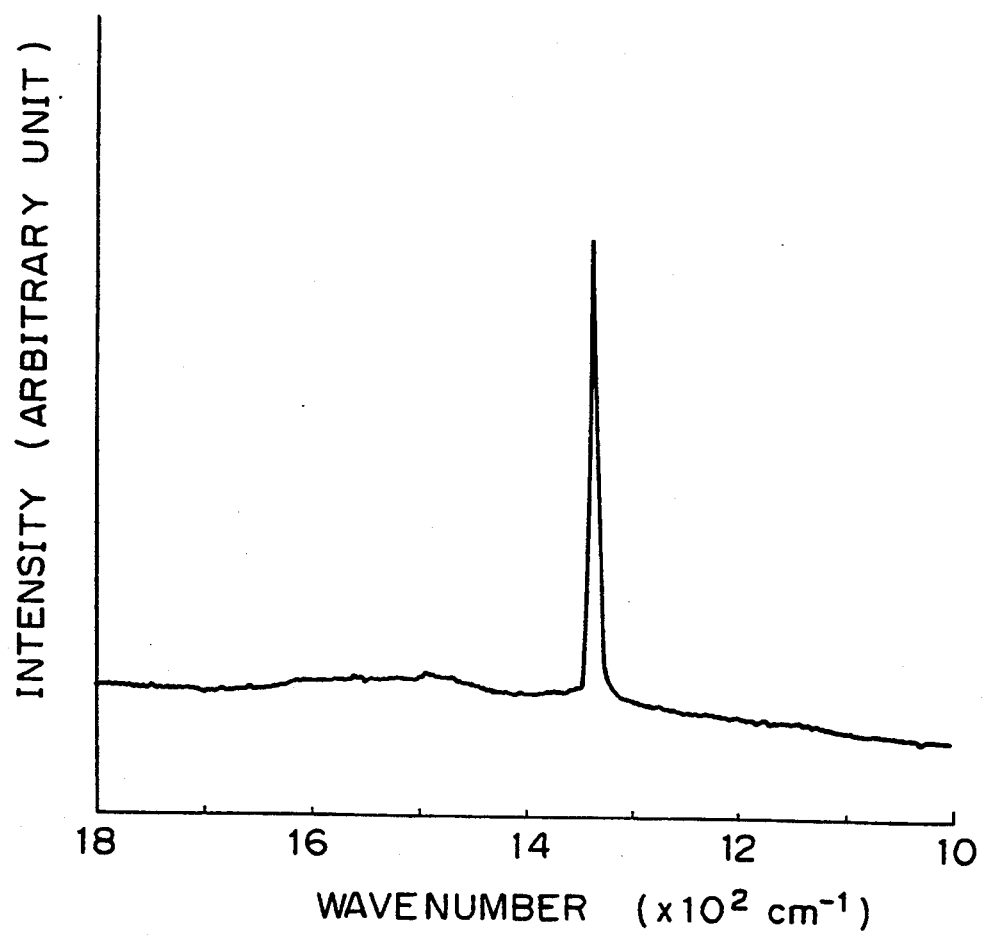
FIG. 23 is a graph showing the Raman spectrum of a diamond film.

As shown in FIG. 20, the surface of the diamond film consisted of diamond crystals arranged regularly gathered together. Also, the SEM in FIG. 21 shows a central portion which is a sectional view of the diamond film, a lower portion which is a sectional view of the silicon substrate, and an upper part which is a surface of a diamond film. It can be understood that the surface of the diamond film is formed uniformly with little unevenness. FIG. 22 shows a X-ray diffraction pattern of the diamond film, with the diamond crystal phases (111), (220), (311) appearing extremely clearly, with (331) and (400) also being recognized. FIG. 23 represents the Raman spectrum of the diamond film, in which the peak inherent in diamond can be recognized also at the wave number 1333 cm$^{-1}$, and as can be easily understood, no peak of other carbonaceous materials, such as graphite, appeared.

As for the Vickers hardness of $Hv_{500}$, a judgement of the pressure mark was difficult due to the high hardness of the sample, but it was found to be 8000 kg/cm$^2$ or higher. From the above data, the diamond synthesized was understood to be polycrystalline film with a good quality. Also, the film thickness was found to be 80 μm, and a diamond film with a good quality was synthesized at a high speed 10-fold or more that of the prior art as, 80 μm/h.

Further, when synthesis was conducted for 10 hours under this condition, the film thickness became about 1 mm at the central portion of the substrate, and 0.6 mm at the peripheral portion thereof. Also, even when measured by X-ray diffraction and, Raman spectrum, only the peak of diamond was obtained, and the presence of graphite was not detected.

Example 3 (FIG. 4)

Using a 10×10×0.2 mm Mo plate as the substrate, as shown in FIG. 4, H₂ gas as the discharging gas 17 was fed at 20 liter/min, Ar gas at 20 liter/min, Ar gas containing 2% acetone as the starting gas 18 was fed at 2 liter/min to the plasma jet, and diamond was synthesized for 1 hour at an arc current of 20 A, a voltage of 60 V, and a nozzle-substrate distance of 10 mm. The film thickness was 60 μm, and the film quality was similar to Example 2.

Examples 4–9 (FIGS. 3 and 4)

Further, the diamond film forming speeds when the reaction conditions were varied by, for example, varying the inter-electrode feeding gas or by feeding the gas into the thermal plasma jet formed between the electrodes, are summarized in the following table. The film qualities of the diamond films obtained were similar to Example 2.

According to the plasma jet CVD method of the present invention, a good quality diamond can be deposited at a speed of 80 μm/h, which is much higher than the speed of the prior art, whereby a great advance was made toward a practical application of cheap diamond by vapor phase synthesis. When the diamond synthesized according to the method is used for the heat sink of a semiconductor or as a circuit substrate, a great reduction in cost and improvement of performance is obtained.

Figure 24:
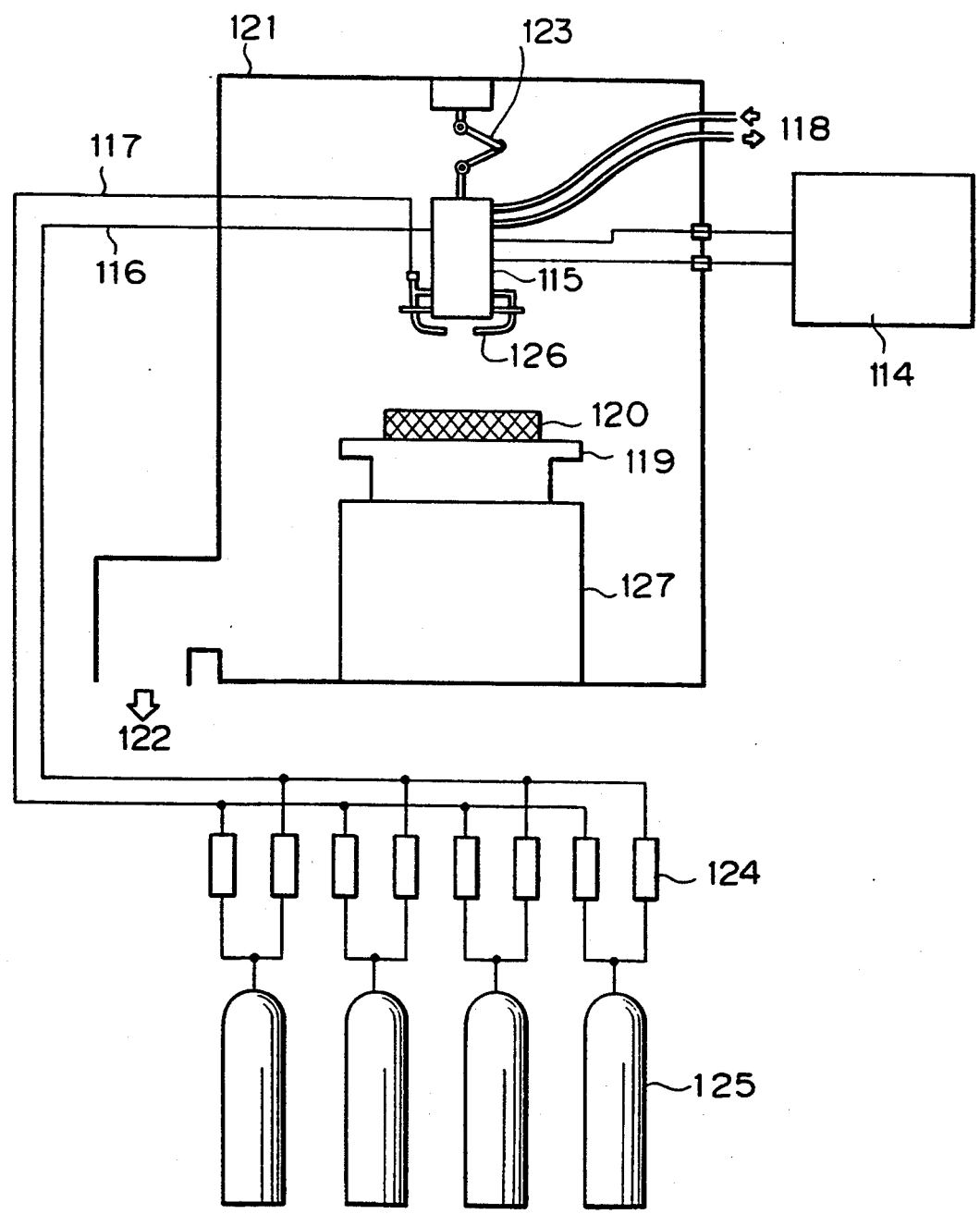
FIG. 24 is a drawing showing the gas cooling DC plasma jet vapor phase synthesis device of the present invention.

Example 10 (FIG. 24)

FIG. 24 illustrates a diamond synthesis device according to the gas cooling DC plasma jet CVD method practiced by the present invention, in which 115 is a plasma torch, 116 a discharge gas feeding pipe, 117 a cooling gas feed pipe, 114 an arc power source, 118 a cooling water pipeline for the torch, 119 a substrate holder, 120 a substrate, 121 a vacuum chamber, 122 an evacuation system, 123 a torch manipulator, 124 a flow meter, 125 a gas bomb, 126 a cooling gas jetting outlet, and 127 a substrate manipulator.

The plasma torch has a water-cooling structure made of tungsten having 2 wt % yttrium oxide added thereto together with the anode and the cathode 38. The position and the direction respectively of the plasma torch 115 and the substrate holder 119 can be controlled by the manipulators and therefore, a diamond film can be uniformly grown on a large area substrate or a material to be treated with a complicated surface shape. Also, although not shown in FIG. 24, the substrate holder 119 may be also mounted with a heater for heating the substrate or a water-cooling mechanism for controlling a substrate temperature.

Example 11 (FIG. 24)

Using an Si wafer 5×5×0.2 mm as the substrate, after an internal evacuation of the vacuum chamber to 2×10$^{-3}$ Torr, hydrogen as the discharge gas was flowed at 20 liter/min under a pressure of 1 kg/cm$^2$ and methane at a flow rate of 80 ml/min under a pressure of 1 kg/cm$^2$ was flowed between the electrodes, and hydrogen was flowed at 20 liter/min under a pressure of 1 kg/cm$^2$ as the cooling gas to maintain the pressure in the vacuum chamber at 200 Torr. The cooling gas supplied from the cooling gas supply pipe 117 in FIG. 24 was jetted out toward the plasma jet through the four cooling gas jetting outlets 126 placed 3 mm below the torch nozzle. From the constant current arc power source 114, a current of 10 A was flowed between the both electrodes of the plasma torch 115 and maintained for 5 minutes until the voltage became constant. The voltage at this time was 65 V. By bringing the substrate holder 119 slowly closer to the nozzle of the torch 115, the nozzle-substrate distance was fixed at 5 mm, and the film formation was conducted under this state for 10 minutes. The diamond prepared was evaluated according to scanning electron microscope (SEM), X-ray diffraction, Raman spectroscopy, and hardness measurements.

Figure 25:
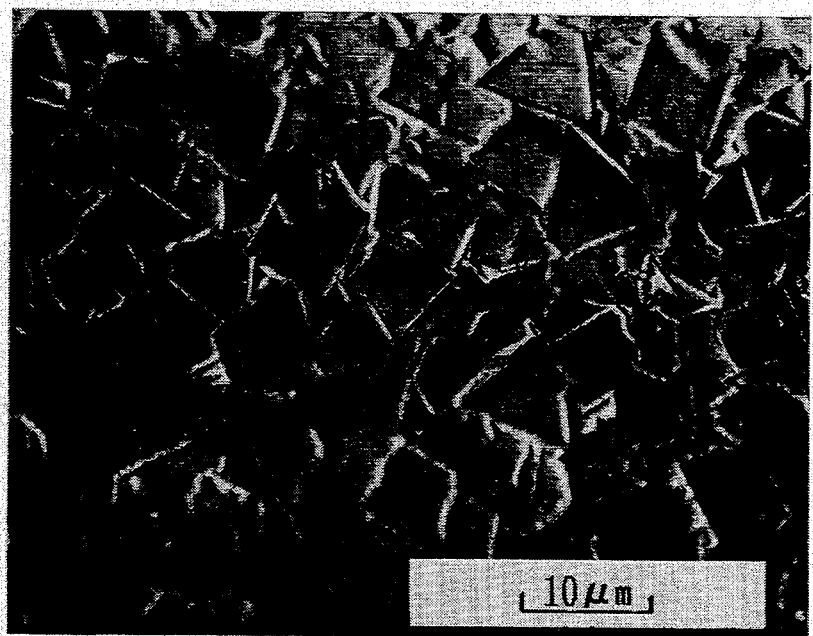
FIG. 25 is an SEM showing the surface of a diamond film.

It can be seen from the SEM shown in FIG. 25 that the surface of the diamond has diamond crystals with a regular arrangement gathered together.

Figure 26:
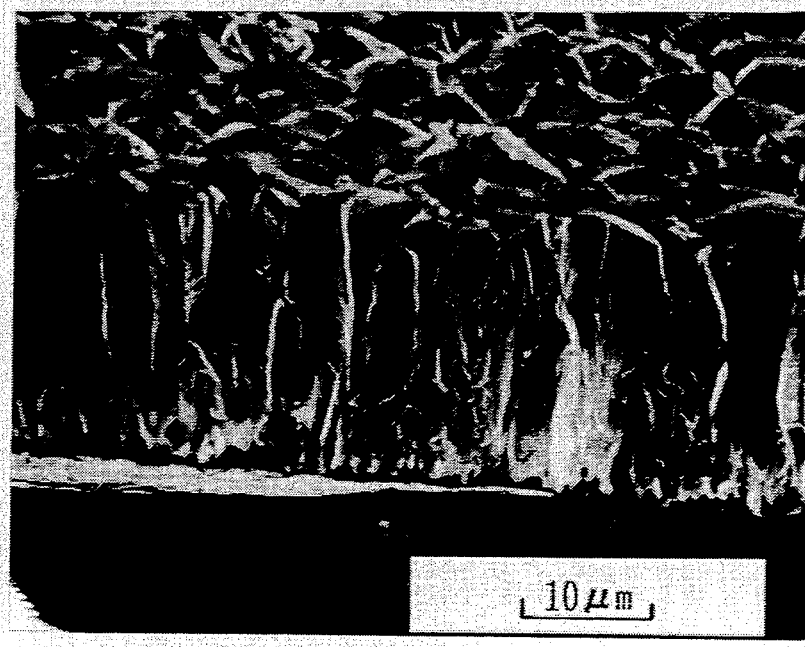
FIG. 26 is an SEM showing a surface and sectional view of a diamond film.

On the other hand, the SEM in FIG. 26 shows a sectional view of the diamond at the central portion and a sectional view of the silicon substrate at the lower portion and a surface of the diamond film at the upper portion, and it can be seen that the surface of the diamond film is uniformly formed with little unevenness.

It can be also seen that the diamond synthesized is a dense polycrystal having a clear self-form, and that the film thickness is about 15 $\mu$m.

As for the Vickers hardness, this value was found to be equal to natural diamond, at about 10000 kg/cm$^2$ under a load of 500 g.

From the above results, it can be understood that the diamond synthesized is a polycrystalline film of good quality. Also, it can be understood that the film deposition rate is as high as 100 $\mu$m/h.

Example 12 (FIG. 24)

When a platinum plate $10 \times 10 \times 1$ mm was used as the substrate under the film forming conditions of Example 11, and further, the plasma torch was scanned on the platinum plate at a speed of 2 mm/h, a diamond film with the thickness of 0.4 mm was formed on the platinum plate. The diamond film was then peeled from the platinum plate to give a diamond plate $10 \times 10 \times 0.4$ mm.

Examples 13–22 (FIG. 24)

In the following, the results of attempts to synthesize diamond under various conditions are shown.

Examples of diamonds of good quality prepared at high speed:

| Example | 13 | | 14 | | 15 | | 16 | | 17 | |
|---|---|---|---|---|---|---|---|---|---|---|
| Discharge gas (l/min) | H$_2$ | 20 | H$_2$ | 10 | H$_2$ | 20 | H$_2$ | 20 | H$_2$ | 20 |
| | | | Ar | 10 | CH$_4$ | 0.2 | | | | |
| | | | CH$_4$ | 0.06 | H$_2$O | 0.1 | | | | |
| Cooling gas (l/min) | H$_2$ | 20 | H$_2$ | 20 | H$_2$ | 20 | H$_2$ | 20 | H$_2$ | 20 |
| | CH$_4$ | 0.5 | | | | | acetone | 2 | CH$_3$Cl | 0.5 |
| Substrate | Si | | Si | | Si | | Si | | Si | |
| Thickness (mm) | 2 | | 2 | | 2 | | 2 | | 2 | |
| Pressure (Torr) | 200 | | 200 | | 200 | | 200 | | 200 | |
| Current (A) | 10 | | 10 | | 10 | | 10 | | 10 | |
| Nozzle-substrate distance (mm) | 5 | | 5 | | 5 | | 5 | | 5 | |
| Film deposition rate ($\mu$m/h) | 100 | | 70 | | 80 | | 100 | | 60 | |

Examples in which diamond was not of a good quality:

| Example | 18 | | 19 | | 20 | | 21 | | 22 | |
|---|---|---|---|---|---|---|---|---|---|---|
| Discharging gas (l/min) | H$_2$ | 20 | H$_2$ | 10 | H$_2$ | 20 | H$_2$ | 20 | H$_2$ | 20 |
| | | | Ar | 10 | CH$_4$ | 0.5 | | | CH$_4$ | 0.08 |
| | | | CH$_4$ | 0.06 | | | | | H$_2$O | 0.1 |
| Cooling gas (l/min) | H$_2$ | 20 | H$_2$ | 20 | H$_2$ | 20 | H$_2$ | 20 | H$_2$ | 20 |
| | CH$_4$ | 0.5 | | | | | acetone | 0.2 | | |
| Substrate | Si | | Si | | Si | | Si | | Si | |
| Thickness (mm) | 2 | | 2 | | 2 | | 2 | | 2 | |
| Pressure (Torr) | 200 | | 200 | | 200 | | 200 | | 200 | |
| Arc current (A) | 10 | | 20 | | 10 | | 10 | | 10 | |
| Nozzle-substrate distance (mm) | 20 | | 5 | | 5 | | 5 | | 5 | |
| Film deposition rate ($\mu$m/h) | | | | | 300 | | 10 | | | |
| Product | none | | substrate melted | | amorphous carbon | | diamond | | none | |

Figure 27:
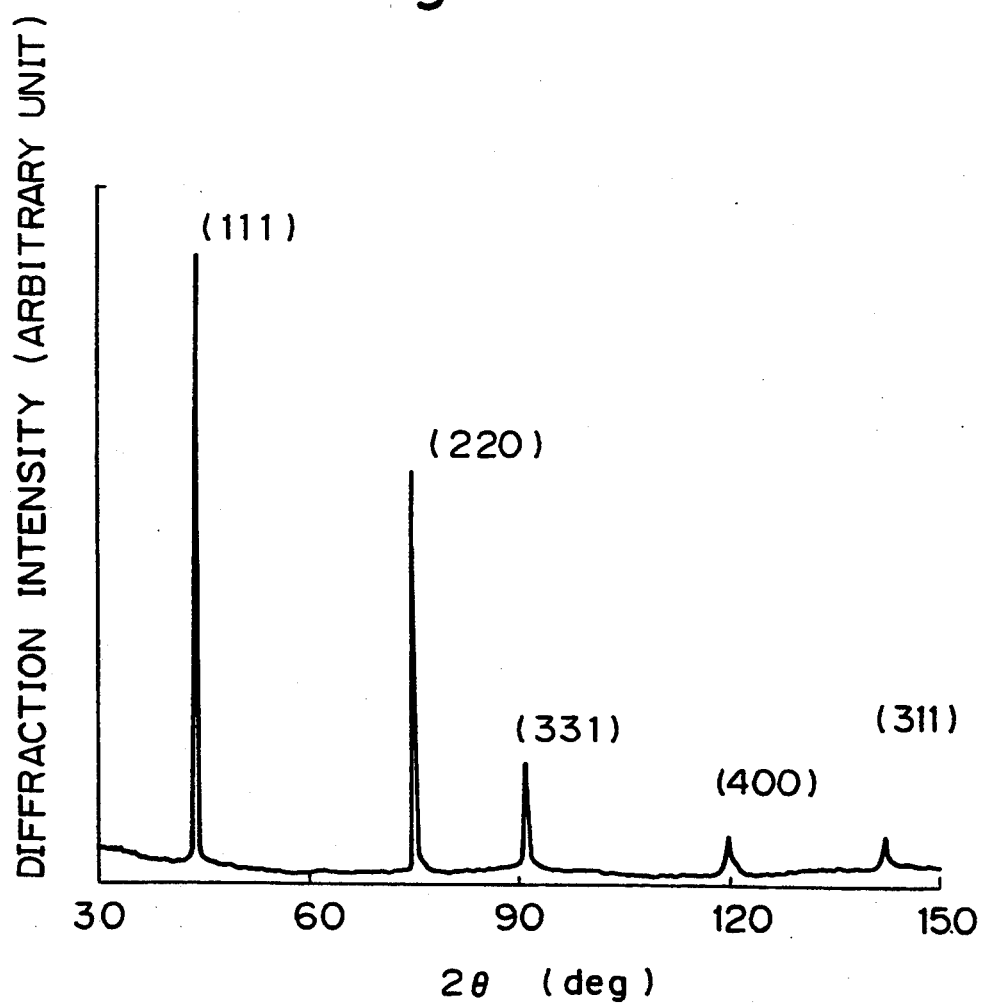
FIG. 27 is a graph showing the results of an X-ray diffraction of a diamond film.
Figure 28:
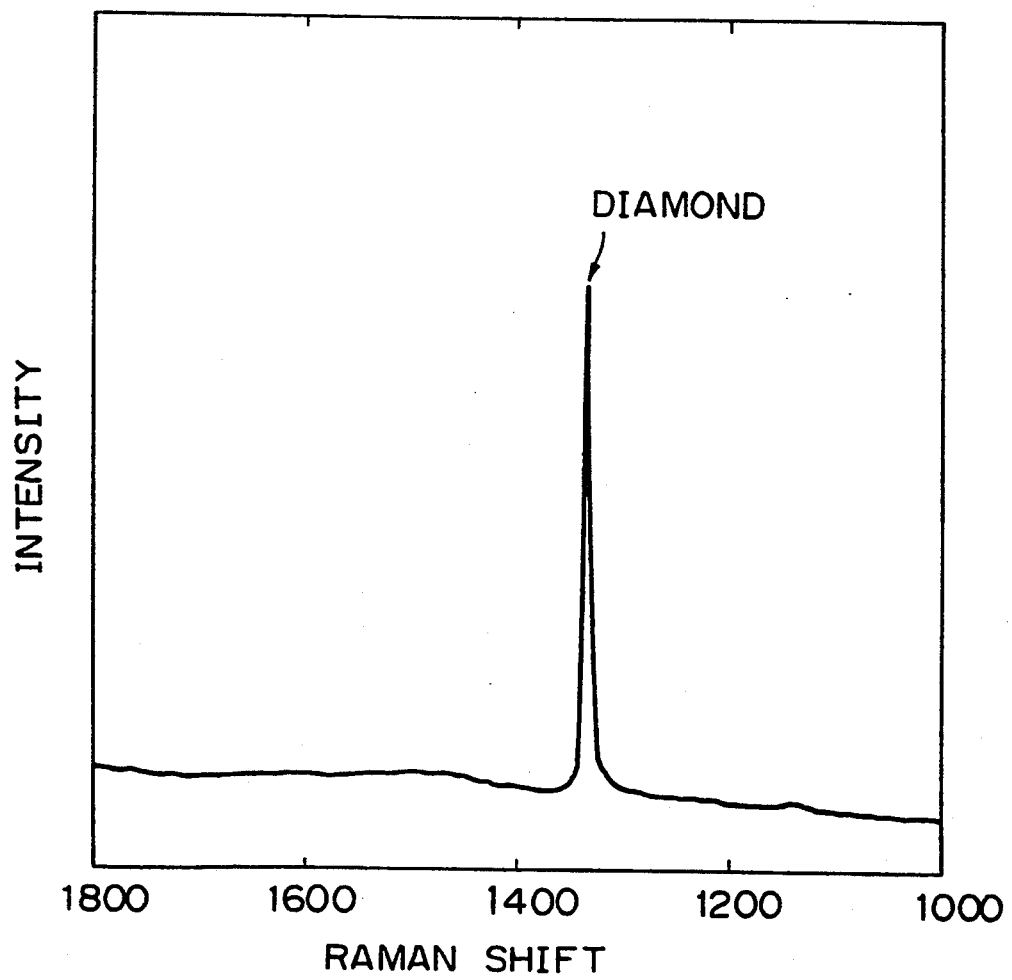
FIG. 28 is a graph showing the Raman spectrum of a diamond film.

FIG. 27 shows an X-ray diffraction pattern of the diamond film with a CuX$_1$ line, with the diamond crystal faces (111), (220), (311) appearing extremely clearly, (331) and (400) also being recognized. Thus, only sharp peaks of the cubic crystal diamond are detected. FIG. 28 shows the Raman spectrum of the diamond film, in which the peak inherent in diamond can be recognized also at the wave number 1333 cm$^{-1}$, and yet it can be understood that a peak of other carbonaceous materials, such as graphite, can not be seen.

Comparative Example 1

In the above-mentioned Example, gas cooling was not employed:

Using an Si wafer $5 \times 5 \times 0.2$ mm as the substrate, after an internal evacuation of the vacuum chamber to $2 \times 10^{-3}$ Torr, hydrogen was flowed as the discharging gas at 20 liter/min under a pressure of 1 kg/cm$^2$, methane at a flow rate of 40 ml/min under a pressure of 1 kg/cm was flowed between the electrodes, to maintain the pressure in the vacuum chamber at 100 Torr. From a constant current arc power source, a current of 10 A was passed through the torch and maintained for 5 minutes until the voltage became constant. The voltage at this time was 65 V. The substrate holder 119 in FIG. 24 was brought slowly closer to the torch 115 and the nozzle-substrate distance was fixed at 15 mm, film deposition was performed under this state for 1 hour, and a diamond film of good quality with a thickness of 60 μm was obtained.

In the above example, as the means for forming an active non-equilibrium plasma with a high radical concentration by quenching thermal plasma, an example is shown in which a cooling gas was impinged on the plasma jetted out from the four cooling gas jetting outlets against the thermal plasma, but the cooling gas may be jetted toward the axis center of the plasma jet. It is also possible to jet the cooling gas in only one direction against the plasma jet, for forming temperature distribution or no distribution of the radical concentration.

According to the gas cooling DC plasma jet CVD method of the present invention, because thermal plasma can be quenched irrespective of the substrate, compared with the DC plasma jet CVD method of the prior art, diamond can be grown on any substrate. A diamond of a good quality can be grown at a high film deposition rate of about 100 μm/h without cooling the substrate, whereby the diamond coating application range can be greatly widened.

This is a great advance toward the practical application of cheap diamond by vapor phase synthesis, and the diamond synthesized according to this method will have a greatly reduced cost and an improved performance when used for a heat sink or as a circuit substrate for a semiconductor, and the thus a diamond heat sink or diamond circuit substrate for a semiconductor can be easily realized.

Example 23 and Comparative Example 2 (FIG. 14)

Using the devices shown in FIG. 13 (Comparative Example 2) and FIG. 14 (Example 23), a silicon substrate 10 mm×10 mm×0.5 mm (thickness) was placed on a substrate holder cooled with cooling water, and a diamond film was deposited on the substrate by a plasma torch using tungsten as the electrode.

In the device shown in FIG. 14, when a gas mixture of 20 liter/min of hydrogen gas and 0.2 liter/min of methane gas was introduced to effect discharge, the discharge voltage was fluctuated by as much as ±20 V with 90 V as the center, and the shape of the plasma jet was greatly changed, but a diamond film with a thickness of 180 μm was deposited in 1 hour. This film exhibited a peak of only diamond when analyzed by X-ray diffraction and Raman spectroscopy.

On the other hand, in the device as shown in FIG. 14, when hydrogen gas and methane gas were separately introduced into the respective torches with hydrogen at 20 liter/min and methane at 0.2 liter/min to effect discharge, the discharge voltage of the torch for hydrogen was an extremely stable 100 V±2 V and the discharge voltage of the torch for methane was 30 V ±2 V, and the shape of the plasma jet was constant, to give a homogeneous diamond film with a film thickness of about 150 μm.

As described above, according to the present invention, since hydrogen gas and a carbon compound gas such as methane gas are fed as individual plasma jets, a diamond film can be formed extremely stably and yet at a high efficiency, compared with the prior art, whereby the demand for substrate for LSI's can be satisfied. Also, according to the present invention, a heated filament, a microwave discharge, and an RF discharge can be utilized instead of the DC arc discharge.

Example 24 (FIG. 19)

FIGS. 19 and 24 schematically illustrates a plasma jet CVD device used in the practice of the method of the present invention, in which 115 is a plasma torch, 116 a discharge gas feed pipe, 114 an arc power source, 118 a cooling water pipeline for torch, 119 a substrate holder, 120 a diamond substrate, 121 a vacuum chamber, 122 an evacuation system, 123 a torch manipulator, 124 a flow meter, 125 a gas bomb, 126 a starting gas feed pipe, and 127 a substrate manipulator.

The plasma torch 115 has a water-cooled structure made of tungsten having 2% by weight of yttrium oxide added thereto together with the anode and the cathode. The position and direction of the plasma torch 115 and the substrate holder 119 can be controlled by the manipulators 123, 127 and can be moved relative to the plasma jet and the substrate, whereby it is possible to grow a diamond film uniformly even on a substrate with large area or on a material with a complicated surface shape. Also, although not shown in this schematic drawing, for controlling the substrate temperature, a heater for heating the substrate or a water-cooling mechanism may be also mounted.

Using an artificial diamond substrate of the IIa type 2×2×0.5 mm, after evacuation of the chamber to 2×10 Torr, the pressure in the chamber was maintained at 120 Torr by flowing hydrogen as the discharge gas at 20 liter/min under a pressure of 1 kg/cm² and methane as the starting gas at 0.1 liter/min under a pressure of 1 kg/cm.

A current of 20 A was flowed from constant current arc power source to the torch and maintained until the voltage became constant for about 5 minutes. The voltage at this time was 50 V. When the substrate was brought slowly closer to the torch, the nozzle-substrate distance was fixed at 15 mm and film formation was conducted under this state for 1 hour.

When the diamond prepared was evaluated by Raman spectroscopy and hardness measurement, a peak only of diamond was detected in Raman spectroscopy, and the Vickers hardness had a value equal to natural diamond which was about 10000 under a load of 500 g. The film thickness of the diamond was about 150 μm, and the film forming speed was 150 μm/h.

Also, according to X-ray diffraction by the Laue method, and low energy electron diffraction (LEED), it was confirmed that a single crystal diamond film was epitaxially grown on the base diamond substrate.

The fluctuation in arc voltage was found to be about 10% in this example. Thus, arc stability was also improved, compared with that of the prior art method, which was about 20%.

Further, in this example, a generation of graphite was not detected.

Example 25

Further, by mixing 0.1 ml/min of $B_2H_6$ as a doping gas into the starting gas under the film forming conditions of Example 24, and the film formation was conducted for 10 minutes, a p-type semiconduct diamond having $10^{-2}$ Ω.cm specific resistance is obtained.

Example 26

Using an Si wafer 5×5×0.2 mm as the substrate, after evacuation of the chamber to 2×10⁻³ Torr, the pressure in the chamber was maintained at 100 Torr by passing hydrogen as the discharge gas at 20 liter/min under a pressure of 1 kg/cm² and methane as the starting gas at 0.5 liter/min under a pressure of 1 kg/cm².

A current of 20 A was flowed from the constant current arc power source to the torch and maintained until the voltage became constant for about 5 minutes. The voltage at this time was 50 V. The substract was brought slowly closer to the torch, the nozzle-substrate distance was fixed at 20 mm, and film formation was conducted under this state for 1 hour.

The diamond prepared was evaluated by X-ray diffraction, Raman spectroscopy and hardness measurement. As a result, by X-ray diffraction and Raman spectroscopy, a peak only of diamond was detected, and the Vickers hardness had a value equal to natural diamond, which was about 10000 under a load of 500 g. The film thickness of diamond was about 200 $\mu$m, and the film deposition rate was 200 $\mu$m/h.

When the surface roughness of the diamond film synthesized was measured, the $R_{max}$ was found to be about 10 $\mu$m, which was greatly improved compared with the value of 50 $\mu$m when the starting gas was fed while contained in the discharge gas.

The fluctuation and arc voltage during a synthesis of diamond was found to be about 10% in this example, in which the arc stability was also improved compared with the about 20% of the prior art method.

Further, in this example, a generation of graphite at the surrounding portion of the substrate was not detected.

Example 27

A molybdenum plate of 5×5×0.5 mm was used as the substrate, methane as the starting gas was fed at a rate of 0.2 l/min, and DC current of 10 A and DC voltage of 90 V were applied to the anode and cathode electrodes, under the film forming conditions of Example 26. Similar results were obtained.

As to the shape of the plasma jetting device, a sectional view is shown in FIG. 19, but the cathode 103 and the anode 104 may be arranged concentrically, and the starting gas jetting outlet of the cathode 103 and the nozzle 106 may be a polyhedral (rectangular, etc.) or ellipsoidal, provided that a non-uniformity of the discharge characteristics is brought about. Also, if necessary, it is possible to provide a heat-resistant insulating material in the shape of comb teeth on the electrode, which will not influence discharge. This is advantageous then coating a large area.

As the substrate other than diamond, quartz glass, tungsten, molybdenum, etc. can be used for growth of a film without treatment of the surface.

As the discharge atmosphere, application under a reduced pressure for discharge stability is preferred, but application under atmospheric pressure or under pressurization is also possible. In the above example, an example of diamond film growth was shown, but the method is also applicable for a synthesis of a diamond powder.

Also, the plasma jet jetting device of the present invention is also applicable for the plasma flame spraying of a high temperature super-conductive oxide such as Ba—Y—Cu—O system, etc. as described above.

When a diamond film is grown by means of the improved type DC plasma jet CVD device of the present invention, a diamond film of a good quality with an excellent surface smoothness can be synthesized at a rapid film deposition rate of about 200 $\mu$m/h, whereby the range of application of the diamond film can be greatly extended.

By performing an epitaxial growth of diamond according to the DC plasma jet CVD method, an epitaxial film as thick as 150 $\mu$m can be obtained at an extremely high film forming speed of 150 $\mu$m/h.

A diamond heat sink or diamond circuit substrate for semiconductor devices can be easily realized, and further, a semiconductor diamond can be synthesized. Also, the method is applicable for the plasma flame spraying of an inorganic compound such as a high temperature super-conductive oxide, etc.

We claim:

1. A direct current plasma torch apparatus for vapor deposition comprising:
   a first electrode having a first polarity comprising an enclosed body defining therein a plurality of open nozzles for jetting thermal plasma and a discharge feed pipe;
   a second electrode disposed in said body and comprising a plurality of individual electrode elements, said second electrode having a second polarity opposite to said first polarity, said electrodes being arranged to present a discharge zone therebetween, said feed pipe being disposed for feeding a feed gas into said zone;
   a power source supply system for applying a direct current voltage between said electrodes at said zone to form the discharge gas that is fed to the zone into a thermal plasma and to cause said thermal plasma to be jetted through said nozzle as a plasma jet;
   a starting gas feeding system for feeding gaseous starting compounds for vapor phase deposition into said plasma jet;
   a support for supporting a substrate in the plasma jet and permitting a thermal plasma chemical vapor deposition film to be deposited from the vapor phase onto the substrate; and
   means for cooling the substrate by first cooling said support,
   said nozzles of the first electrode each having an inner wall and said electrode elements of the second electrode each being positioned adjacent a respective inner wall as so to present at least a portion of said discharge zone therebetween.

2. An apparatus as set forth in claim 1, wherein said cooling means and said support together present a water-cooled substrate holder.

3. An apparatus as set forth in claim 1, wherein said electrodes are formed from a high heat resistance material comprising a mixture of tungsten and a rare earth element oxide.

4. An apparatus as set forth in claim 3, wherein said oxide is an oxide of lanthanum, yttrium or cerium.

5. An apparatus as set forth in claim 1, wherein said electrodes are formed from carbon.

* * * * *

UNITED STATES PATENT AND TRADEMARK OFFICE
CERTIFICATE OF CORRECTION

PATENT NO. : 5,403,399
DATED : April 4, 1995        Page 1 of 2
INVENTOR(S) : KAZUAKI KURIHARA et al.

It is certified that error appears in the above-indentified patent and that said Letters Patent is hereby corrected as shown below:

Title page [60], after "Apr. 4, 1988" insert --now USP 5,368,897, Nov. 29, 1994--;

[56] References Cited line 3, delete "Bejat" and substitute --Bejat et al.--;

line 7, delete "Eger" and substitute --Eger et al.--.
Column 1, line 8, after "1988" insert --now USP 5,368,897, Nov. 29, 1994--.
Column 5, line 1, "a" should be deleted;
    line 48, delete "a ultra-high" and substitute --an ultra-high--.
Column 7, line 32, delete "the".
Column 12, line 50, delete "an feed" and substitute --a feed--.
Column 14, line 24, delete "at";
    line 55, delete "1 kg/cm," and substitute --1 kg/cm$^2$--.
Column 18, line 66, delete "1 kg/cm" and substitute --1 kg/cm$^2$--.

UNITED STATES PATENT AND TRADEMARK OFFICE
CERTIFICATE OF CORRECTION

PATENT NO. : 5,403,399
DATED : April 4, 1995
INVENTOR(S) : KAZUAKI KURIHARA ET AL It is certified that error appears in the above-indentified patent and that said Letters Patent is hereby corrected as shown below:

Column 20, line 31, delete "2x10" and substitute --$2 \times 10^{-3}$

Signed and Sealed this

Fifth Day of December, 1995

Attest:

BRUCE LEHMAN

*Attesting Officer*     *Commissioner of Patents and Trademarks*